United States Patent [19]

Mitsumoto et al.

[11] Patent Number: 5,392,250
[45] Date of Patent: Feb. 21, 1995

[54] SEMICONDUCTOR MEMORY DEVICE

[75] Inventors: Kinya Mitsumoto; Yoshikazu Iida; Hiroki Miyashita; Kazunori Onozawa, all of Takasaki, Japan

[73] Assignee: Hitachi, Ltd., Tokyo, Japan

[21] Appl. No.: 5,219

[22] Filed: Jan. 15, 1993

[30] Foreign Application Priority Data

Jan. 17, 1992 [JP] Japan .................. 4-006211

[51] Int. Cl.⁶ .................. G11C 7/00; G11C 11/40
[52] U.S. Cl. .................. 365/207; 365/190; 365/208; 365/225.6; 365/51; 365/63
[58] Field of Search ........... 365/51, 63, 190, 207, 365/208, 225.6

[56] References Cited

U.S. PATENT DOCUMENTS 4,713,796 12/1987 Ogiue et al. .............. 365/189
4,815,038 3/1989 Scharrer et al. ........... 365/225.6 X
5,068,828 11/1991 Miyaoka et al. ........... 365/203 X
5,111,432 5/1992 Miyaoka .................. 365/208 X

*Primary Examiner*—Do Hyun Yoo
*Attorney, Agent, or Firm*—Antonelli, Terry, Stout & Kraus

[57] ABSTRACT

In a semiconductor memory device of the present invention, data read from a memory cell to a pair of complementary data lines or a pair of common data lines are fed directly to an output circuit not through any sense amplifier. As a result, the delay time of the sense amplifier itself is omitted from the address access time of the conventional semiconductor memory device using the sense amplifier, so that the semi-conductor memory device of the present invention can have its address access time made shorter than that of the conventional semiconductor memory device.

24 Claims, 21 Drawing Sheets

FIG. 2

| STATE | READ STATE | | | |
|---|---|---|---|---|
| | SELECTED MAT | | UNSELECTED MAT | |
| | SELECTED DATA LINES | UNSELECTED DATA LINES | SELECTED DATA LINES | UNSELECTED DATA LINES |
| CIRCUIT | (circuit diagram) | (circuit diagram) | (circuit diagram) | (circuit diagram) |
| (voltage levels) | CDW 0.0 (H)&(L); D −0.2, −0.4, −1.0(H), −1.2(L); CDR | CDW 0.0 (H)&(L); D −0.7 (H), −0.75(L); CDR (H) | CDW 0.0 (H)&(L); D −0.7 (H)&(L); CDR (H), (L) | CDW 0.0 (H)&(L); D −0.7 (H)&(L); CDR (H), (L) |

FIG. 3

SEMICONDUCTOR MEMORY DEVICE

BACKGROUND OF THE INVENTION

1. Field of the Invention

The present invention relates to a semiconductor memory device and, more particularly, to a technology which is effective if applied for accelerating the operation speed of a static type random access memory (as will be abbreviated into the "static RAM").

2. Description of the Prior Art

A semiconductor memory device such as a static RAM or a dynamic RAM composed of MOS transistors (i.e., Metal Oxide Silicon field effect transistors, as abbreviated into MOSFET) is generally composed of the following sense system. Specifically, the data are read by transferring data stored in a memory cell via a pair of complementary data lines or common data lines, to a sense amplifier circuit which detects and amplifies the signal amplitude of the read data. This amplified signal is fed to and is further amplified by an output circuit which, in turn, generates external output data corresponding to the data read from the aforementioned memory cell. The external output data is made available for use outside of the semiconductor chip, formed, e.g., with a static RAM.

An example of a static RAM having a short address access time is exemplified by the static RAM which is composed of bipolar transistors and MOS transistors, such as disclosed in Japanese Patent Laid-Open No. 170090/1985 (corresponding to U.S. Pat. No. 4,713,796). This static RAM utilizes a sense amplifier circuit composed of differentially coupled bipolar transistors so as to shorten the address access time. Thus, the sense system described above is also adopted in the high-speed static RAM which is composed of bipolar transistors and MOS transistors.

SUMMARY OF THE INVENTION

In a case in which the sense system using the aforementioned sense amplifier circuit is intended to shorten the address access time of the semiconductor memory device, an effective method for providing high speed operation is to miniaturize the semiconductor elements themselves, such as the bipolar transistors and MOS transistors, composing the semiconductor memory device.

The present inventors have extensively investigated not only the aspect of speedup of operation of the semiconductor memory device, such as, by miniaturizing the semiconductor elements themselves but also regarding improving the operation speed based on the type of circuit construction of the semiconductor memory device. As a result of these investigations, the present inventors have found out that the shortening of the address access time of the semiconductor memory device is somewhat limited by the delay time of the sense amplifier itself.

An object of the present invention is to provide a semiconductor memory device having a short address access time.

Another object of the present invention is to provide a layout of memory cells, which is effective for accelerating the switching speed and increasing the storage capacity of a semiconductor memory device.

Still another object of the present invention is to provide a semiconductor memory device which has a short address access time and a low power consumption.

The foregoing and other objects and novel features of the present invention will become apparent from the following description to be made with reference to the accompanying drawings.

Representative aspects of the disclosed invention will now be briefly described.

According to the present invention, the data read from a memory cell and transferred as differential signals via a pair of complementary data lines or common data lines are fed directly to an output circuit, i.e. without first being fed to a sense amplifier circuit. In other words, the sense amplifier circuit is omitted from the circuit construction of a semiconductor memory device.

Since the sense amplifier circuit is omitted, the signal amplitude of the data read from the memory cell to the pair of complementary data lines or common data lines, that is, the potential difference attained between the pair of complementary data lines or common data lines must necessarily be of such a high level as to drive the output circuit, coupled thereto, sufficiently. This necessity improves the drivability of the drive MOS transistors which compose the memory cells of the semiconductor memory device and which have their gates and drains cross-coupled. Specifically, if the driver MOS transistors have gate widths which are increased, the memory cells produced have layout areas which are also increased, thereby resulting in elongating the individual complementary data lines. This results in an increase in the parasitic capacitance of the individual complementary data lines, thereby leading to a reduction of the effect of the short address access time, which is caused by omitting the sense amplifier circuit. Therefore, the individual driver MOS transistors are designed with gates folded back into a U-letter shape to suppress any increase in the layout area of the individual memory cells.

If, moreover, the gate width of each of the driver MOS transistors composing the individual memory cells is increased, a high current will flow from the data lines to the lower potential power supply of the semiconductor memory device through the selected ones of the memory cells. In short, the electric current to be consumed by the semiconductor memory device is high. In the semiconductor memory device of the present invention, therefore, the number of memory cells to be selected at one time is reduced so as to reduce the power to be consumed by the semiconductor memory device. Thus, the semiconductor memory device of the present invention has its memory region divided into a plurality of memory mats, for which are provided a plurality of divided word lines. In one access time, moreover, the selection of the plurality of word lines provided for one memory mat is so controlled that one of them may be selected while the others are left unselected.

According to the means described above, the operations are achieved by the following reasons.

In the semiconductor memory device of the present invention, the data read from the memory cell to the pair of complementary data lines or common data lines are fed directly to the output circuit, not through the sense amplifier circuit. This eliminates the delay time of the sense amplifier circuit itself from the address access time of the conventional semiconductor memory device using the sense amplifier circuit so that the address access time of the semiconductor memory device of the present invention can be made shorter than that of the conventional semiconductor memory device.

Moreover, since the individual drive MOS transistors have their gates folded back into the U-letter shape, the increase in the layout area of the individual memory cells is suppressed even though each of the memory cells has a high drivability characteristic. This makes it possible to provide a semiconductor memory device having a quick operation and a high storage capacity if memory cells composed of the drive MOS transistors having the U-shaped gates are used in the semiconductor memory device having no sense amplifier circuit.

Moreover, the selection of the plurality of word lines provided for one memory mat is so controlled that one of them may be selected while the others are left unselected. As a result, the number of memory cells to be selected at one time is reduced even if the highly drivable memory cells, composed of the drive MOS transistors having the U-shaped gates, are used in the semiconductor memory device, thus reducing the power consumption of the semiconductor memory device having the short address access time.

BRIEF DESCRIPTION OF THE DRAWINGS

FIG. 2 is an explanatory diagram showing a reading operation of a static semiconductor memory device of FIG. 1;

FIG. 3 is an explanatory diagram showing a writing operation of a static semiconductor memory device of FIG. 1;

DESCRIPTION OF THE PREFERRED EMBODIMENTS

Figure 1:
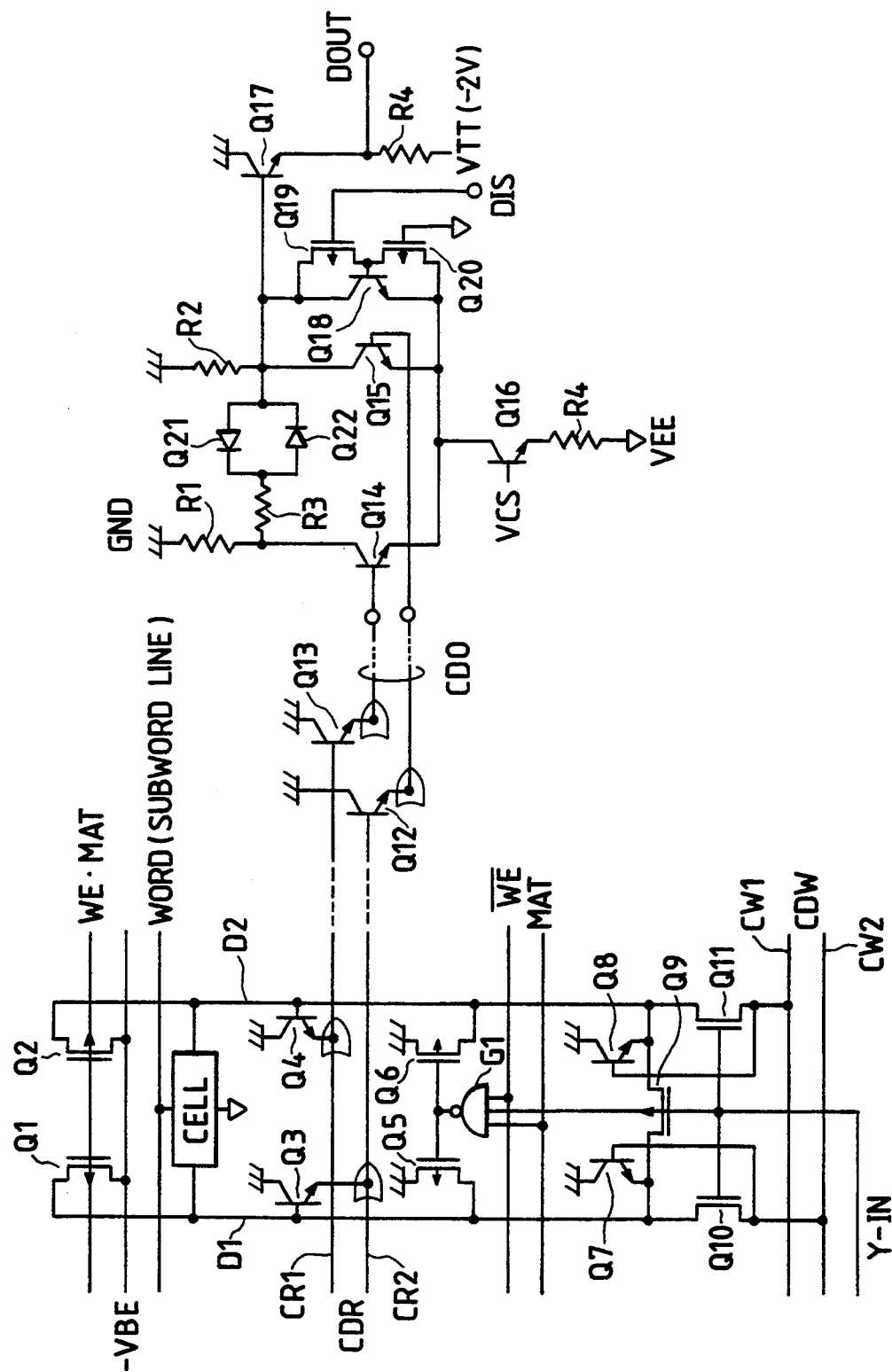
FIG. 1 is a schematic circuit diagram showing one embodiment of a static semiconductor memory device according to the present invention.

FIG. 1 is a schematic circuit diagram showing one embodiment of a static semiconductor memory device according to the present invention. The individual circuit elements composing the circuit of FIG. 1 are formed over one semiconductor substrate of single crystal silicon, although not especially limited thereto, by the bipolar CMOS integrated circuit manufacturing method. In FIG. 1, P-channel MOSFETs Q1 and Q2 and so on are discriminated from N-channel MOSFETs Q10 and Q11 by having their channel portions indicated by arrows.

As shown in FIG. 1, this static random access memory (as will be abbreviated into the "static RAM") includes a word line (or subword line) WORD, a pair of complementary data lines D1 and D2, and a memory cell CELL coupled to the word line WORD and the pair of complementary data lines D1 and D2.

This static memory cell CELL is constructed of a flip-flop for storing information and is exemplified by a highly resistive load type memory cell including highly resistive load elements made of polycrystalline silicon, although not especially limited thereto. This memory cell CELL is constructed, as the memory cell CELL indicated at (0, 0) in FIG. 10, to include: a pair of select MOSFETs Qs1 and Qs2 having their gates coupled to the word line; a pair of driver MOSFETs Qd1 and Qd2 having their gates and drains cross-coupled to each other; and a pair of load resistance elements RL1 and RL2 coupled between the individual drains of the aforementioned paired driver MOSFETs Qd1 and Qd2 and a first power-supply potential node GND, referenced, e.g., at ground potential (e.g., 0 V). The individual sources of the aforementioned paired driver MOSFETs Qd1 and Qd2 are coupled to a second power-supply potential node VEE, supplied with a negative potential such as −5.4 V or −5.2 V. If the memory cell CELL is selected, the cell current flows from each coupled complementary data line D1 or D2 to the second power-supply potential node VEE in accordance with the information "1" or "0" stored therein, so that a potential difference is established between the coupled complementary data lines D1 and D2 by that cell current.

Since the drivabilities of the individual driver MOSFETs Qd1 and Qd2 are set to high levels in the memory cell CELL of the present invention, as will be described hereinafter, the cell current is set to about 0.8 mA, for example, so that the potential difference between the coupled complementary data lines D1 and D2 takes a value of about 200 mV, for example. The memory cell CELL is shown in FIGS. 14 to 22. In the case of the conventional memory device, the cell current is about 0.15 mA, for example, so that the resultant potential difference between the coupled complementary data lines D1 and D2 takes a value of about 30 mV, for example. Incidentally, the memory cell CELL may be of the complete CMOS type, which is constructed of a flip-flop composed of a pair of CMOS inverters having their inputs and outputs cross-coupled. In other words, the load resistance elements RL1 and RL2 of the memory cell CELL may be P-channel MOSFETs.

Between each of the coupled complementary data lines D1 and D2 and a potential node −VBE, which is lower by VBE (e.g., 0.8 V) from the first power-supply potential GND, there are coupled source-drain paths of the P-channel MOSFETs Q1 and Q2 acting as the first load elements. These P-channel MOSFETs Q1 and Q2 have their gates made receptive of a control signal WE.-MAT or an AND of an internal write signal WE and a mat select signal MAT. Thus, the P-channel MOSFETs Q1 and Q2 are turned ON when the read state is established to drop the internal write signal WE to a low level and when the corresponding memory mat is unselected to drop the mat select signal MAT to a low level.

Figure 10:
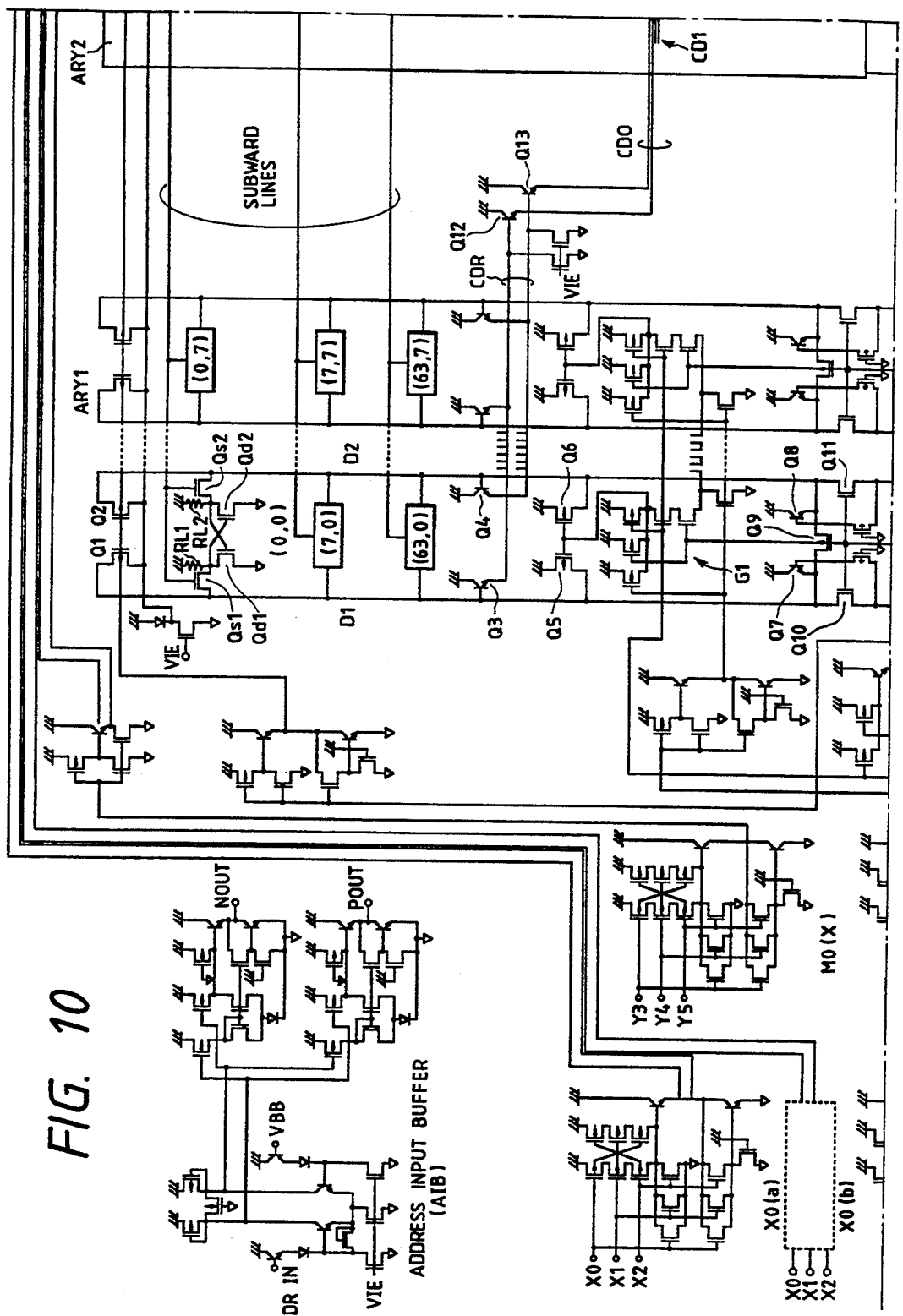
FIG. 10 is a circuit diagram showing a portion of a more detailed logic circuit of the static semiconductor memory device of the present invention.

Between each of the coupled complementary data lines D1 and D2 and the first power-supply potential node GND, there are coupled source-drain paths of P-channel MOSFETs Q5 and Q6 acting as the second load elements. These P-channel MOSFETs Q5 and Q6 have their gates coupled to an output node of a NAND gate circuit G1 which is made receptive of an inverted internal write signal $\overline{WE}$, the mat select signal MAT and a Y-select signal Y-IN. The P-channel MOSFETs Q5 and Q6 are turned ON only when the read state is established to raise the inverted internal write signal, $\overline{WE}$ to a high level, when a corresponding memory mat select state is established to raise the mat select signal MAT to the high level, and when the select state is established to raise the Y-select signal Y-IN to the high level. The NAND gate circuit G1 is constructed of the CMOS circuit, as shown in FIG. 10.

Between each of the coupled complementary data lines D1 and D2 and a pair of reading common data lines CDR (i.e., CR1 and CR2), there are connected NPN bi-polar transistors Q3 and Q4 which together constitute a first emitter-follower circuit. Between the coupled common data lines CDR and differential NPN bi-polar transistors Q14 and Q15, constituting an output circuit together, there are connected NPN bipolar transistors Q12 and Q13 which constitute a second emitter-follower circuit together. These NPN bipolar transistors Q3, Q4, Q12 and Q13 are deemed as a level shift circuit which is provided for transmitting the potential difference (e.g., 200 mV) between the coupled complementary data lines D1 and D2, which will change in response to the stored information "1" or "0" in the selected memory cell CELL, as is to the individual bases of the differential NPN bipolar transistors Q14 and Q15 of the output circuit. The differential NPN bipolar transistors Q14 and Q15 of the output circuit are so designed as to operate satisfactorily in response to complementary input signals having a potential difference of about 100 mV, but a margin of about 100 mV is added to the potential difference (of 200 mV) between the coupled complementary data lines D1 and D2:

In the present invention, therefore, the potential difference between the coupled complementary data lines D1 and D2, which will change in response to the stored information "1" or "0" of the selected memory cell CELL, has such a sufficient potential difference as to operate the differential NPN bipolar transistors Q14 and Q15 of the output circuit.

A pair of writing common data lines CDW (e.g., CW1 and CW2) are coupled to a pair of output nodes of a write circuit WRITE AMP. (as will be abbreviated into "W. A.") shown in FIG. 7, so that they are fed with write data outputted from the write circuit WRITE AMP.

The N-channel MOSFETs Q10 and Q11 are used as Y-select switching MOSFETs which are provided for transmitting the write data, fed onto the writing coupled common data lines CDW, to the coupled complementary data lines D1 and D2. These N-channel MOSFETs Q10 and Q11 have gates to be fed with the Y-select signal Y-IN and source-drain paths coupled individually between the writing coupled common data lines CDW and the coupled complementary data lines D1 and D2. The N-channel MOSFETs Q10 and Q11 are turned ON when the Y-select signal Y-IN is raised to the high level.

A P-channel MOSFET Q9 is an equalizing MOSFET and has a gate to be fed with the Y-select signal Y-IN and a source-drain path coupled between the coupled complementary data lines D1 and D2.

NPN bipolar transistors Q7 and Q8 are individually used as write recovering transistors which have their operations controlled by the potential of the writing coupled common data lines CDW.

The output circuit is of the ECL (i.e., Emitter Coupled Logic) type and is constructed to include: the differential NPN bipolar transistors Q14 and Q15 to be used as the input transistors; collector resistors R1 and R2 coupled between the individual collectors of the transistors Q14 and Q15 and the first power-supply potential node (GND), respectively; an NPN bipolar transistor Q16 (having its base made receptive of a constant voltage VCS) acting as a current source and an emitter resistance element R4; a temperature characteristic compensating circuit having the diodes D1 and D2 and a resistor R3; an emitter-follower output transistor Q17 made of an NPN bipolar transistor coupled between an external terminal DOUT and the collector of the bipolar transistor Q15; and a resistance element R4 used as a load resistor coupled between the emitter of the output bipolar transistor Q17 and a third power-supply potential node (VTT) at a potential such as −2 V.

The output circuit further includes a control circuit composed of an NPN bipolar transistor Q18 and P-channel MOSFETs Q19 and Q20 for bringing the emitter of the NPN output bipolar transistor Q17 to the low level (or high impedance state) in response to a control signal DIS.

Figure 3:
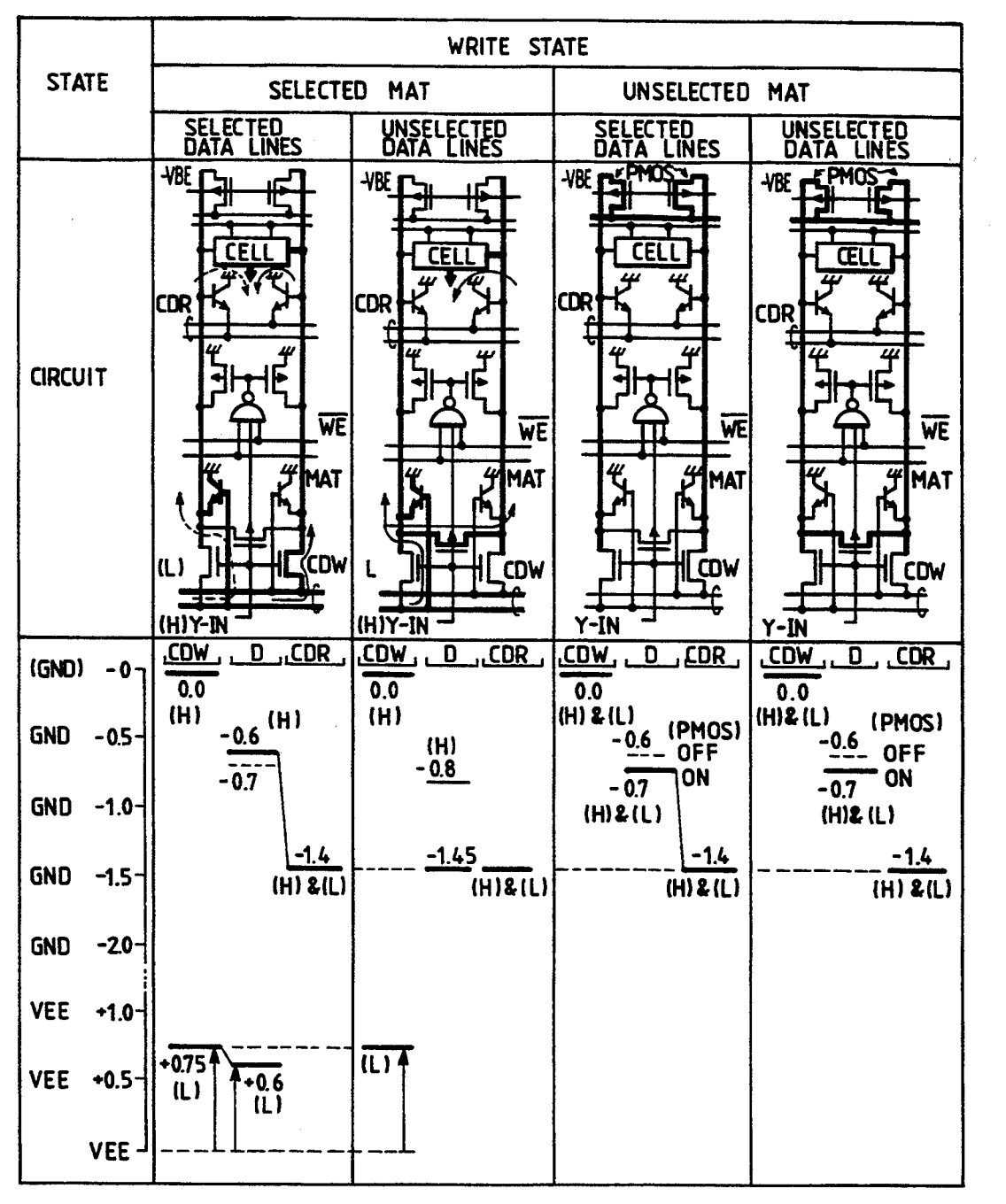

FIG. 2 is an explanatory diagram showing a reading operation of a static semiconductor memory device of FIG. 1. FIG. 3 is an explanatory diagram showing a writing operation of a static semiconductor memory device of FIG. 1.

In FIGS. 2 and 3, the individual potential relations among the writing coupled common data lines CDW, the coupled complementary data lines D1 and D2 (simply designated as D in FIGS. 2 and 3) and the reading coupled common data lines CDR are illustrated in connection with the selected data lines and unselected data lines in a selected mat and the selected data lines and unselected data lines in an unselected mat. In FIGS. 2 and 3, the portions, as indicated by thick solid lines, show the elements in operation and the paths having electric current flowing therethrough.

In the case in which the memory cell CELL is in the selected state, as indicated at the portions of the selected data lines in the selected mat of FIG. 2, the output of the NAND gate G1 takes the low level. As a result, the P-channel MOSFETs Q5 and Q6 are turned ON to bias the coupled complementary data lines D1 and D2 to a value generally at the ground potential. Since the memory cell CELL is selected, a potential of about 200 mV is established between the coupled complementary data lines D1 and D2, as has been described hereinbefore. In the case of another state of FIG. 2, the P-channel MOSFETs Q5 and Q8 are in their OFF states so that the coupled complementary data lines D1 and D2 have their potentials biased to a value of about −0.8 V (e.g., −0.75 or −0.7 V in FIG. 2) by either the P-channel MOSFETs Q1 and Q2 connected with the potential of −VBE or the bipolar transistors Q7 and Q8 which are connected with the writing coupled common data lines CDW to be biased to the high level such as the ground potential.

Thus, the selected data lines in the selected mat in the read state of FIG. 2 achieve the highest potential so that the NPN bipolar transistors Q3 and Q4 coupled to the selected data lines are exclusively turned ON. As a result, the potential of the reading coupled common data lines CDR is outputted by subtracting the potential VBE from the potential of the coupled complementary data lines D1 and D2 or the selected data lines. Thus, the potential prepared by subtracting the value 2VBE (VBE=0.8 V) from the potential of the coupled complementary data lines D1 and D2 or the selected data lines is outputted from the emitters of the NPN bipolar transistors Q12 and Q13. As is apparent from FIGS. 6 to 9 or FIGS. 10 to 13, the NPN bipolar transistors Q3 and Q4 constituting the first emitter-follower circuit are constituted as eight sets of wired OR circuits, and the NPN bipolar transistors Q12 and Q13 constituting the second emitter-follower circuit are also constituted as eight sets of wired OR circuits. In short, the circuit portions of the NPN bipolar transistors Q3, Q4, Q12 and Q13 constitute sixty four wired OR circuits.

In the case in which the memory cell CELL is selected in the write state, as indicated in the portions of the selected data lines in the selected mat of FIG. 3, the write data fed to the writing coupled common data lines CDW and having a low level "L" of about (VEE+0.75 V) and a high level such as the ground potential are fed to the coupled complementary data lines D1 and D2 through the N-channel MOSFETs Q10 and Q11 which are turned ON. As a result, the potential of the data lines D1 and D2 in the selected state is given a high level of 0.6 V (which changes to −0.7 V when in operation) and a low level of (VEE+0.6 V).

On the other hand, the wiring coupled common data lines CDW are biased to the high level such as the ground potential, as indicated in the portions of the unselected data lines in the selected mat of FIG. 3. As a result, the potential of one of the coupled complementary data lines D1 and D2 is biased to the value of about (GND−0.8 V) by the bipolar transistor Q7 or Q8, whereas the potential of the other coupled complementary data lines D1 and D2 is biased to the value of about (GND−1.45 V) by the selected memory cells.

Although not specifically limited thereto, in the case of the write state, the low level "L" of (VEE+0.8 V) (or VEE+0.75 V) is inputted to one of the writing coupled common data lines CDW and is transmitted through the switch MOSFET Q10 or Q11 to the coupled complementary data line D1 or D2 so that the data are written in the memory cell CELL. Since, at this time, the P-channel MOSFETs Q5 and Q6 are in the OFF state, no through current is established.

In the case of both the selected and unselected data lines of the unselected mat in FIG. 3, the potential of the coupled complementary data lines D1 and D2 is biased to about (GND−0.8 V) (alternatively, in FIG. 3, this potential is biased to (GND−0.6 V) in the case where the P-channel MOSFETs Q1 and Q2 are in the ON state or to (GND−0.7 V) in the case where the P-channel MOSFETs Q1 and Q2 are in the OFF state) by either the P-channel MOSFETS Q1 and Q2 connected with the potential node −VBE or the bipolar transistors Q7 and Q8 connected with the writing coupled complementary data lines CDW biased to the high level such as the ground potential.

In the case in which the state of the selected memory mat is switched from the write state to the read state, the writing coupled common data lines CDW are biased to the high level "H" such as the ground potential. Since the coupled complementary data lines D1 and D2 and the writing coupled common data lines CDW are connected by the N-channel MOSFETs Q10 and Q11, the recovery time period for the potential of one of the coupled complementary data lines D1 and D2 at about (VEE+0.6 V) when in the write state to be biased to about (GND−0.8 V) is elongated. In order to shorten this recovery time period, there are provided the write recovering transistors Q7 and Q8 one of which is turned ON if one of the writing coupled common data lines CDW is raised to the high level "H" such as the ground potential. As a result, the coupled complementary data lines D1 and D2 are quickly charged to the bias potential of about −0.8 V. The method described above shortens the access time of the case, in which the static semiconductor memory device of the present invention is changed from the write state to the read state.

Figure 4:
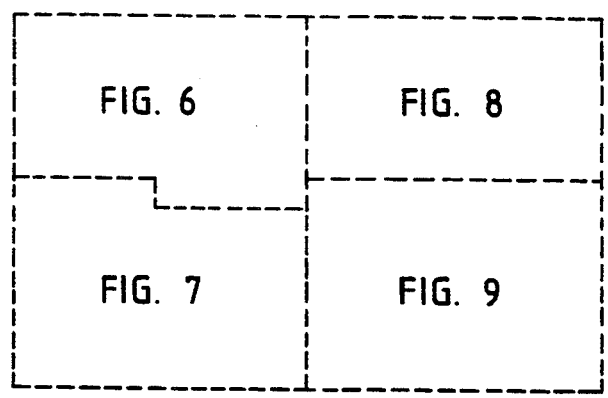
FIG. 4 is a detailed combinatorial diagram of logic circuits of the static semiconductor memory device of the present invention shown in FIGS. 6 to 9.

FIG. 4 is a detailed combinatorial diagram of logic circuits of the static semiconductor memory device of the present invention shown in FIGS. 6 to 9.

Figure 5:
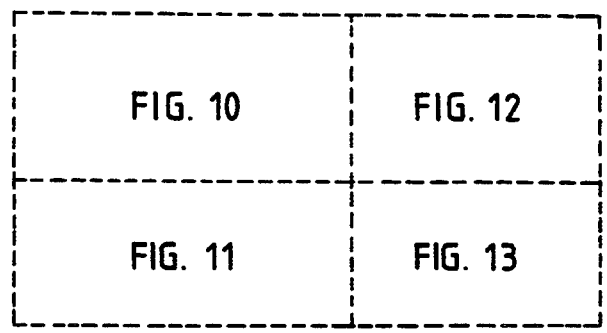
FIG. 5 is a more detailed combinatorial diagram of logic circuits of the static semiconductor memory device of the present invention shown in FIGS. 10 to 13.

FIG. 5 is a more detailed combinatorial diagram of logic circuits of the static semiconductor memory device of the present invention shown in FIGS. 10 to 13.

FIGS. 10 to 13 correspond to the detailed circuit diagrams of the logic circuits shown in FIGS. 6 to 9. Incidentally, FIGS. 6 to 13 are the detailed circuit diagrams of the static semiconductor memory device shown in FIG. 1, and the elements identical to those of FIG. 1 are designated by common reference letters. In FIGS. 6 to 9, the logic gate circuits, in which the output portions of logic gate circuit symbols are painted out in black, indicate bipolar CMOS logic gate circuits including bipolar transistors at the output portions, and the logic gate circuits, in which the output portions of the logic gate circuit symbols are not painted out in black, indicate CMOS logic gate circuits. These indications will be easily understood from FIGS. 10 to 13. Incidentally, the portion of a memory array ARY1 of the memory mat 1MAT is shown in detail, but the remaining memory arrays ARY2 to ARY4 in the mat 1MAT are likewise constructed. Moreover, the other memory mats 2MAT to 8MAT are also constructed like the memory mat 1MAT.

As will be apparent from FIGS. 6 to 13, the static semiconductor memory device of the present invention includes eight memory mats (i.e., 1MAT to 8MAT) each composed of four memory arrays (i.e., ARY1 to ARY4), although not especially limited thereto. Each of these memory arrays is composed of eight pairs of complementary data lines D1 and D2, sixty-four subword lines, and five hundreds and twelve memory cells. In the same Figures, the memory cells are indicated at (0, 0) to (63, 7).

As will be apparent from those Figures, moreover, the static semiconductor memory device is equipped with eight main word lines. In the static semiconductor memory device of the present invention, therefore, if one set of address signals are received: one of the eight memory mats (1MAT to 8MAT) is selected; one of the eight main word lines is selected; and one of the sixty four subword lines is selected. By adopting such divided word lines, the number of memory cells to be selected at one time is reduced to reduce the power consumption of the semiconductor memory device. On the other hand, the coupled complementary data lines are selected, as follows. If one set of address signals are received, there are selected one pair of complementary data lines D1 and D2 in each of the memory arrays in the selected memory mat. As a result, the four pairs of complementary data lines D1 and D2 are selected from the selected memory mat so that the semiconductor memory device can input and output data of 4 bits.

The construction of the static semiconductor memory device, as shown in FIGS. 6 to 13, will be described in detail in the following.

Figure 6:
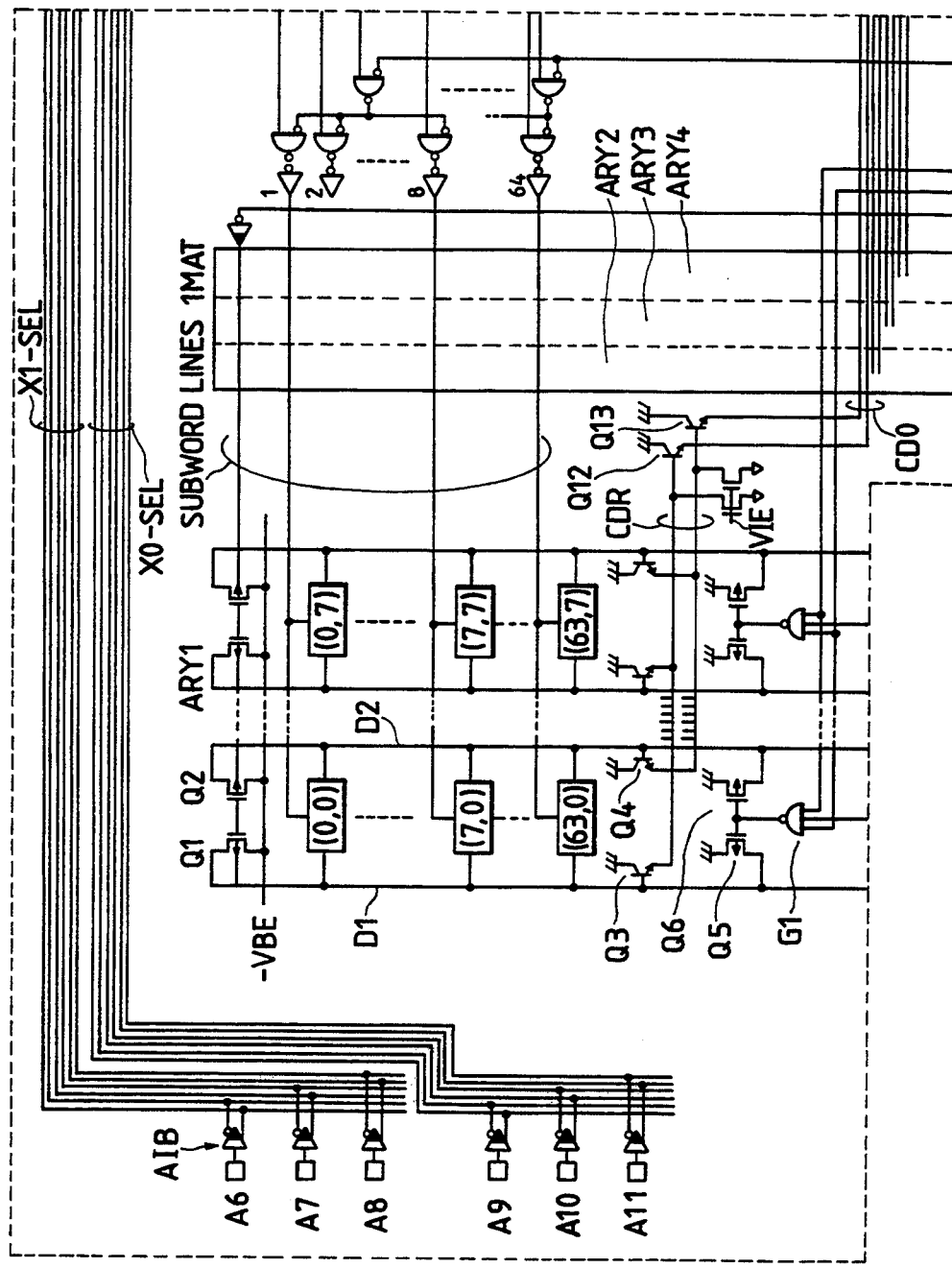
FIG. 6 is a circuit diagram showing a portion of a detailed logic circuit of the static semiconductor memory device of the present invention.
Figure 7:
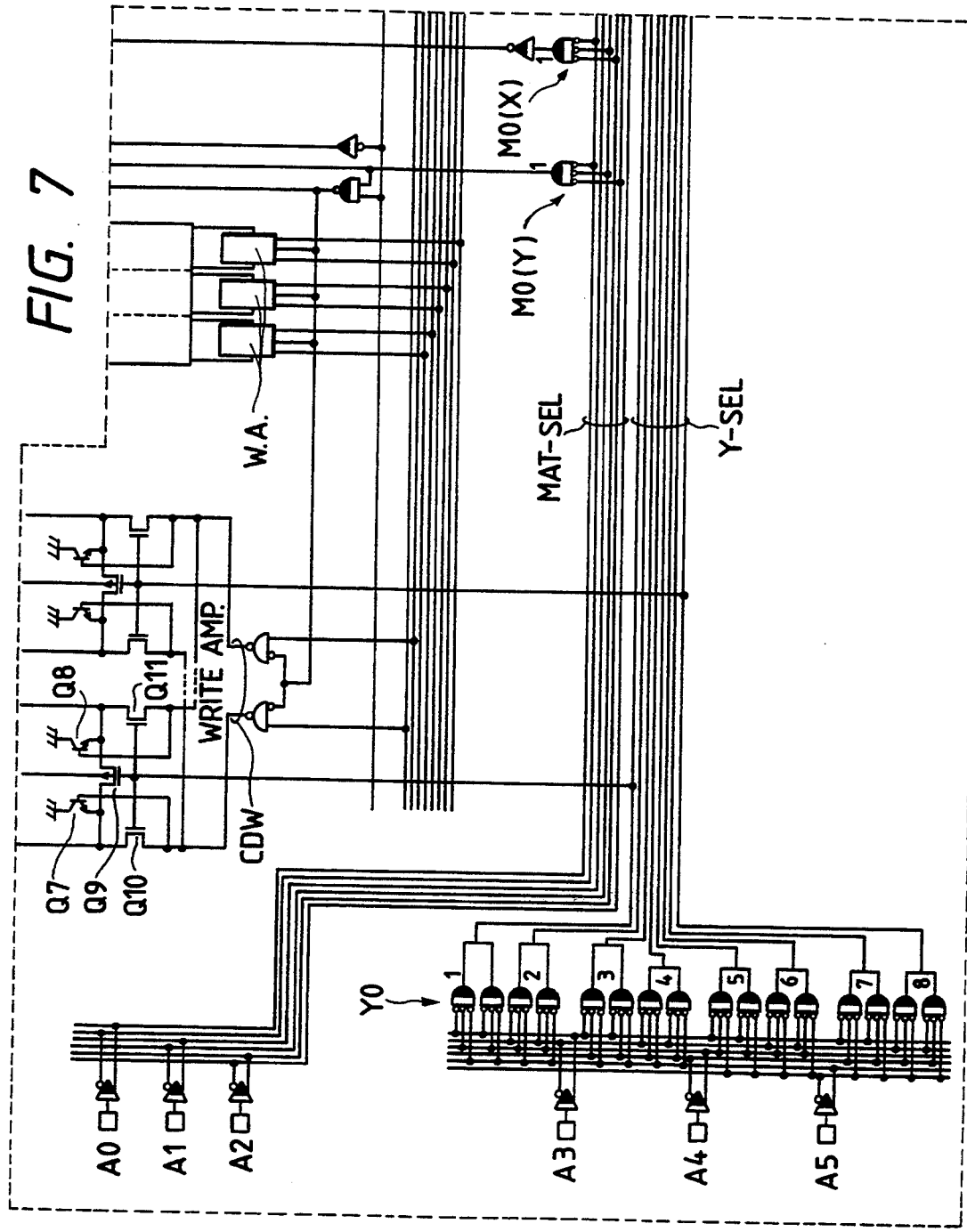
FIG. 7 is a circuit diagram showing another portion of a detailed logic circuit of the static semiconductor memory device of the present invention.
Figure 8:
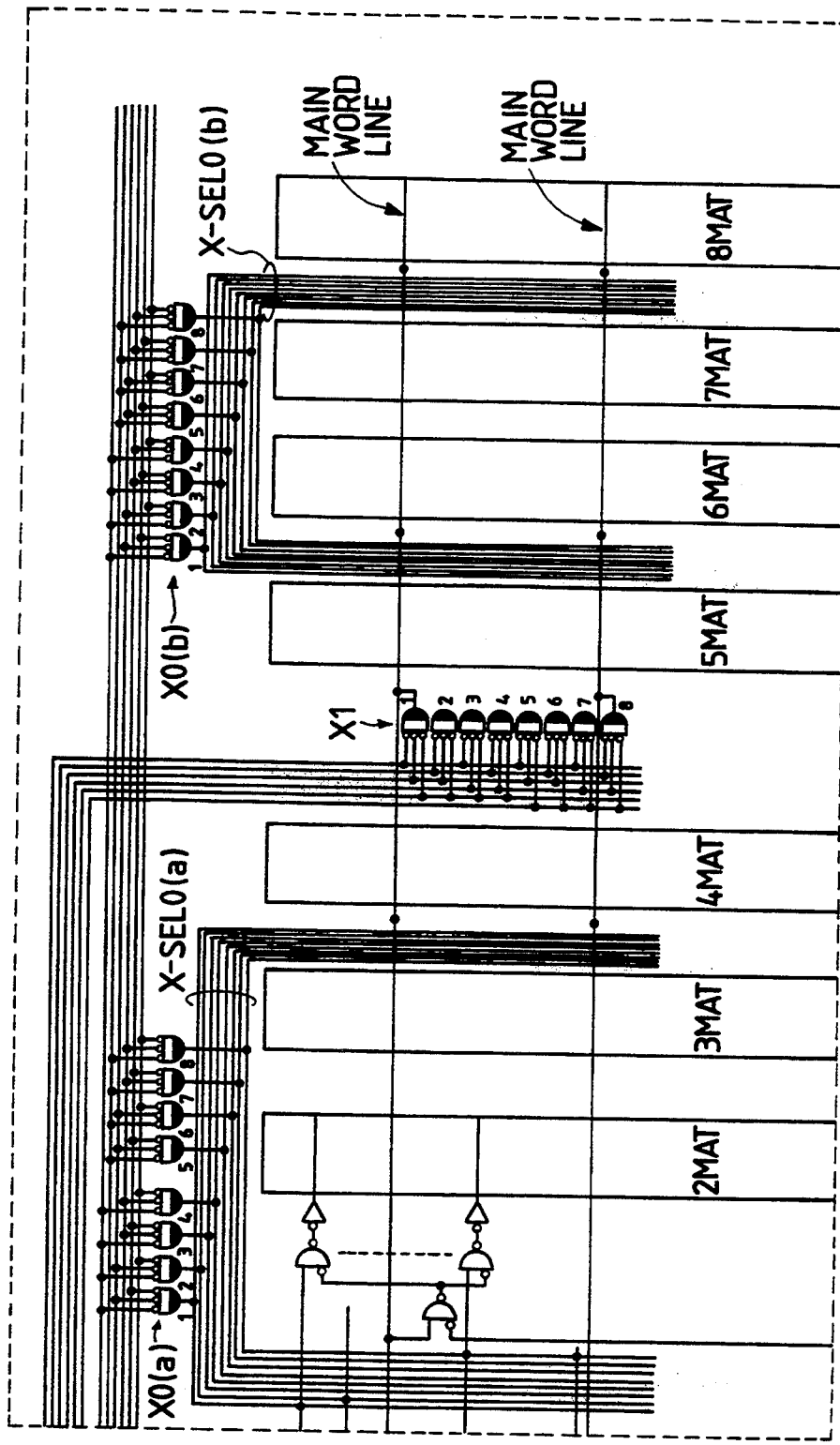
FIG. 8 is a circuit diagram showing a still another portion of a detailed logic circuit of the static semiconductor memory device of the present invention.

The address signals of the ECL level are inputted to address input terminals A0 to A11, as shown in FIGS. 6 and 7. The address signals inputted to the address input terminals A0 to A2 are used to produce mat select signals for selecting one of the eight memory mats; the address signals inputted to the address input terminals A3 to A5 are used to produce data line select signals for selecting four of the thirty-two coupled complementary data lines in the selected memory mat; the address signals inputted to the address input terminals A6 to A8 are used to produce main word line select signals for selecting one of the eight main word lines; and the address signals inputted to the address input terminals A9 to A11 are used to produce subword line select signals for selecting one of the sixty-four subword lines.

The address signals thus inputted to the address input terminals A0 to A11 are fed through address input buffers AIB to individual decoder circuits. Incidentally, the detailed circuit diagram of the address input buffer AIB is constructed, as shown in FIG. 10, of an ECL input circuit which is composed of NPN input bipolar transistors, N-channel MOSFETs and P-channel MOSFETs.

Figure 11:
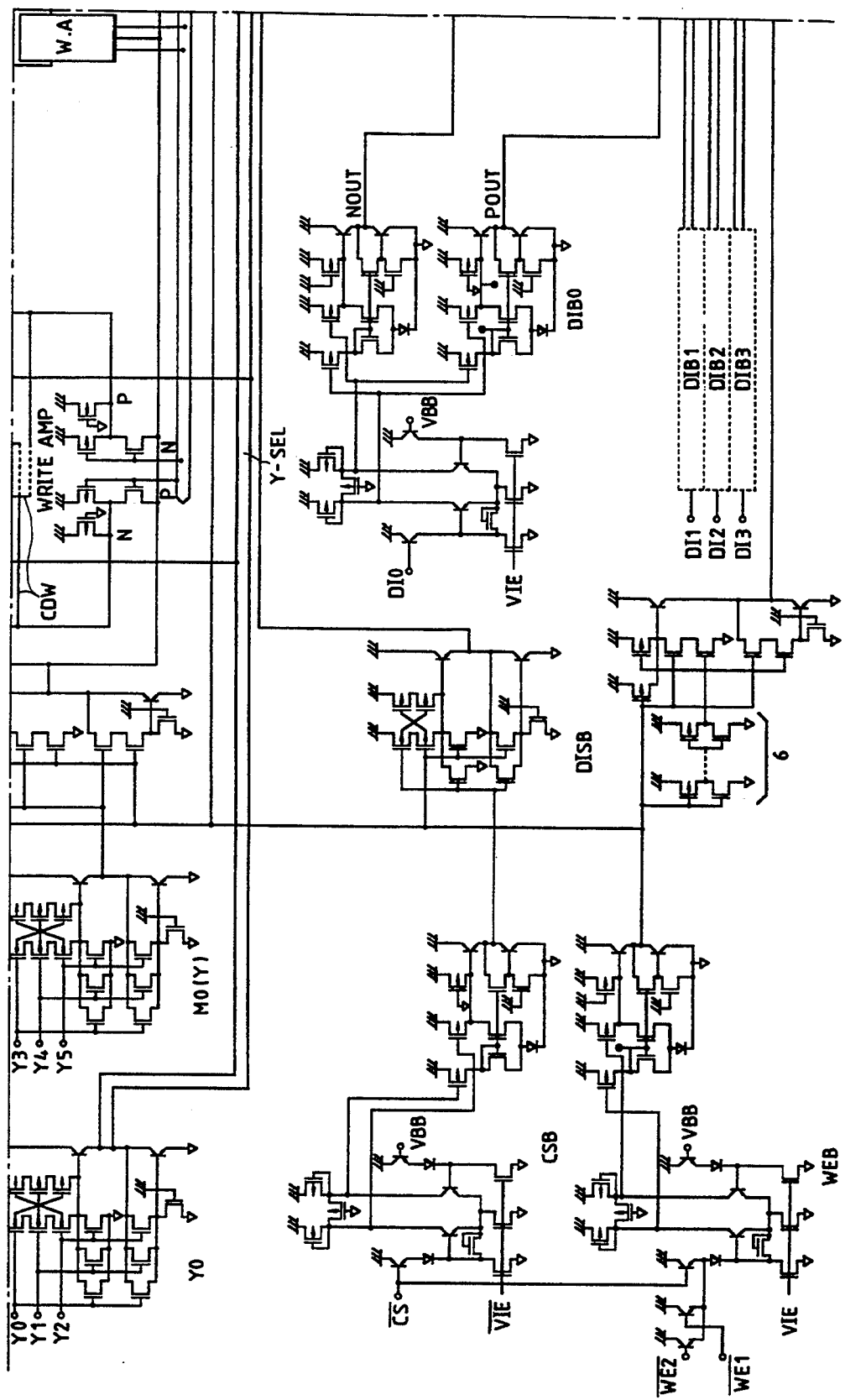
FIG. 11 is a circuit diagram showing another portion of a more detailed logic circuit of the static semiconductor memory device of the present invention.

The address signals inputted to the address input terminals A0 to A2 are fed through a MAT-SEL line including eight signal lines to a mat decoder circuit. This mat decoder circuit is provided for each memory mat and includes gate circuits M0(X) and M0(Y). The detailed circuit diagram of each of the gate circuits M0(X) and M0(Y) is constructed, as shown in FIGS. 10 and 11, to include: an input unit constructed of a CMOS logic circuit composed of N-channel MOSFETs and P-channel MOSFETs; and an output unit composed of bipolar transistors. Incidentally, the numbers attached to the gate circuits in the mat decoder circuit indicate those of the corresponding memory mats.

The address signals inputted to the address input terminals A3 to A5 are fed to and decoded by eight Y-decoder circuits including sixteen gate circuits Y0. Each of these gate circuits Y0 is constructed, as shown in FIG. 11, to include an input unit composed of CMOS logic circuits and an output unit composed of bipolar transistors. The decoded output signals (i.e., Y-IN of FIG. 1) of the Y-decoder circuits are fed to the individual memory mats through a Y-SEL line composed of eight signal lines. As a result, the output load capacitances of the Y-decoder circuits are increased so that the two gate circuits Y0 are connected for use in parallel. As a result, the output load capacitances of the Y-decoder circuits are quickly charged and discharged by the two gate circuits Y0 connected in parallel, so that the data line selecting operation of the static semiconductor memory device is accelerated.

Figure 12:
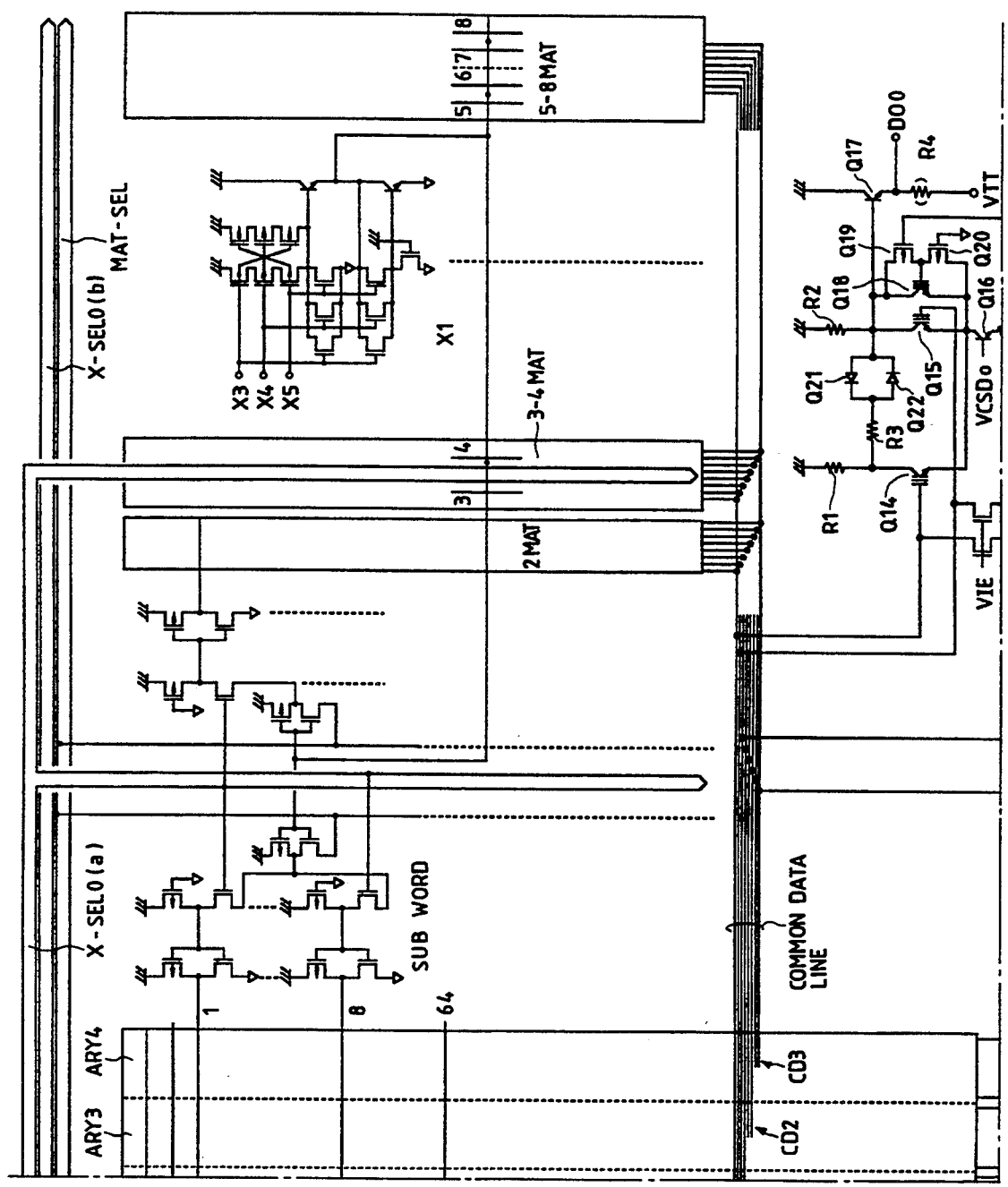
FIG. 12 is a circuit diagram showing a still another portion of a more detailed logic circuit of the static semiconductor memory device of the present invention.

The address signals inputted to the address input terminals A6 to A8 are fed through an X1-SEL line composed of eight signal lines to a main word decoder circuit, which is arranged between the memory mats 4MAT and 5MAT, so that they are decoded by the main word decoder circuit. This main word decoder circuit has its output coupled to the eight main word lines. The main word decoder circuit is composed of eight gate circuits X1, each of which includes, as shown in FIG. 12, an input unit constructed of a CMOS logic circuit and an output unit composed of bipolar transistors. As a result, the main word lines having their load capacitances increased by arranging them over a long distance over the memory mat are quickly charged and discharged by the main word decoder circuit. Incidentally, this main word decoder circuit additionally has a function as a main word driver circuit.

The address signals inputted to the address input terminals A9 to A11 are fed through an X0-SEL line composed of eight signal lines to a subword decoder circuit. This subword decoder circuit includes a first decoder provided to correspond to the memory mats 1MAT to 4 MAT and a second decoder provided to correspond to the memory mats 5MAT to 8MAT. The first decoder is formed of eight gate circuits X0(a), and the second decoder is formed of eight gate circuits X0(b). Each of these gate circuits X0(a) and X0(b) includes an input unit composed of a CMOS logic circuit and an output unit composed of bipolar transistors, as shown in FIGS. 10 and 11. The decoded output of the first decoder is fed through an X-SEL(a) line composed of eight signal lines to both a first subword driver arranged between the memory mats 1MAT and 2MAT and a second subword driver arranged between the memory mats 3MAT and 4MAT. Likewise, the decoded output of the second decoder is fed through an X-SEL(b) line composed of eight signal lines to both a third subword driver arranged between the memory mats 5MAT and 6MAT and a fourth subword driver arranged between the memory mats 7MAT and 8MAT. Each subword driver has its output coupled to the subword line, which is provided in the corresponding memory mat, and made receptive of the output signal coming from the corresponding gate circuit M0(X) of the mat decoder circuit.

As a result, if the static semiconductor memory device of the present invention receives a set of address signals: one of the eight memory mats (1MAT to 8MAT) is selected; one of the eight main word lines is selected; and one of the sixty four subword lines is selected.

On the other hand, the data lines are selected, as follows. Specifically, one of the eight memory mats is selected by the mat decoder circuit, and four of the thirty two coupled complementary data lines provided in the four memory arrays in the selected memory mat are selected by the Y-decoder circuit. Incidentally, the four selected complementary data couples are individually the coupled complementary data lines D1 and D2 in each of the memory arrays (ARY1 to ARY4) in the selected memory mat. As a result, the four pairs of complementary data lines D1 and D2 are selected from the selected memory mat so that the static semiconductor memory device can input and output data of 4 bits.

Figure 9:
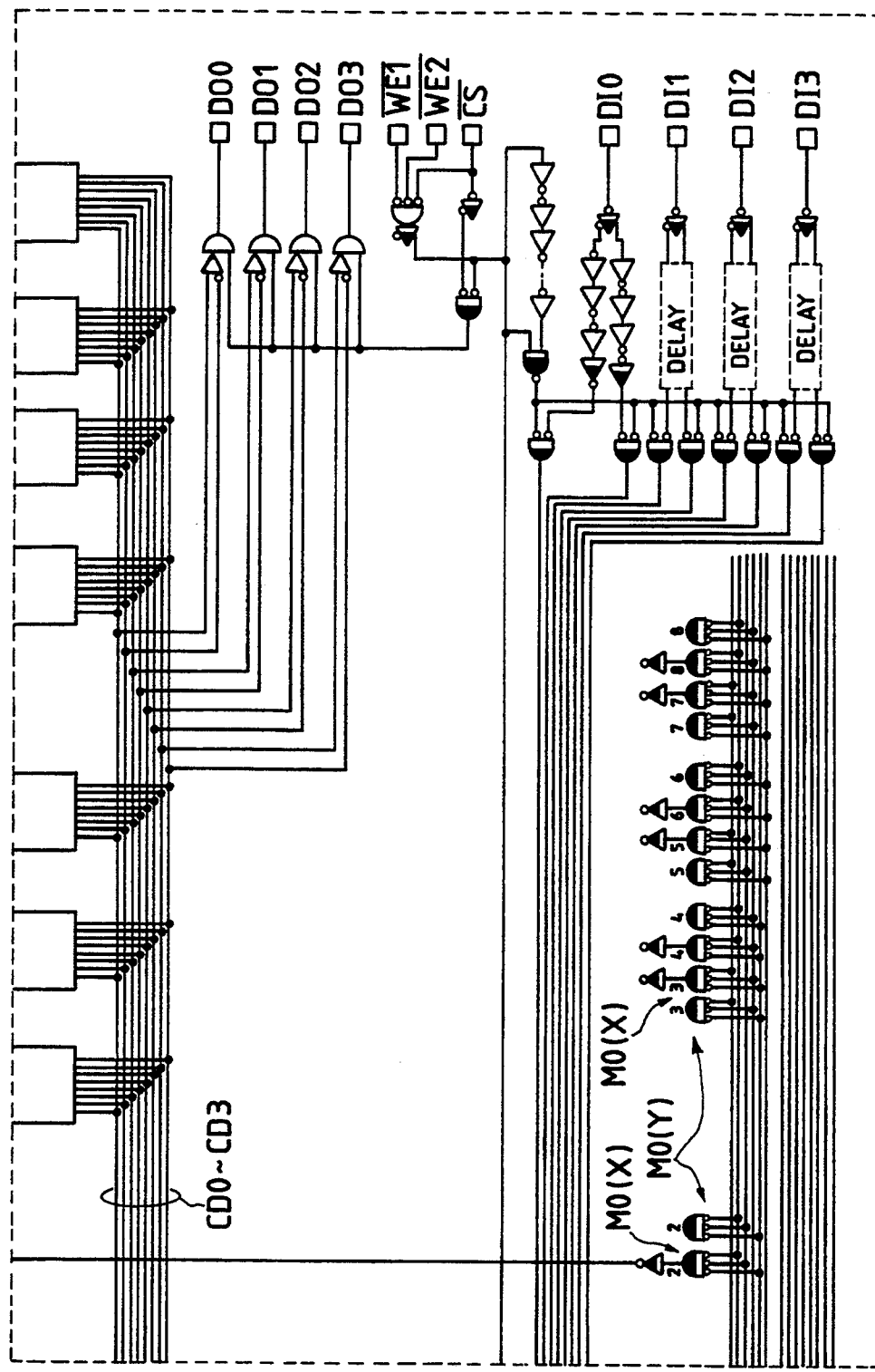
FIG. 9 is a circuit diagram showing a further portion of a detailed logic circuit of the static semiconductor memory device of the present invention.
Figure 18:
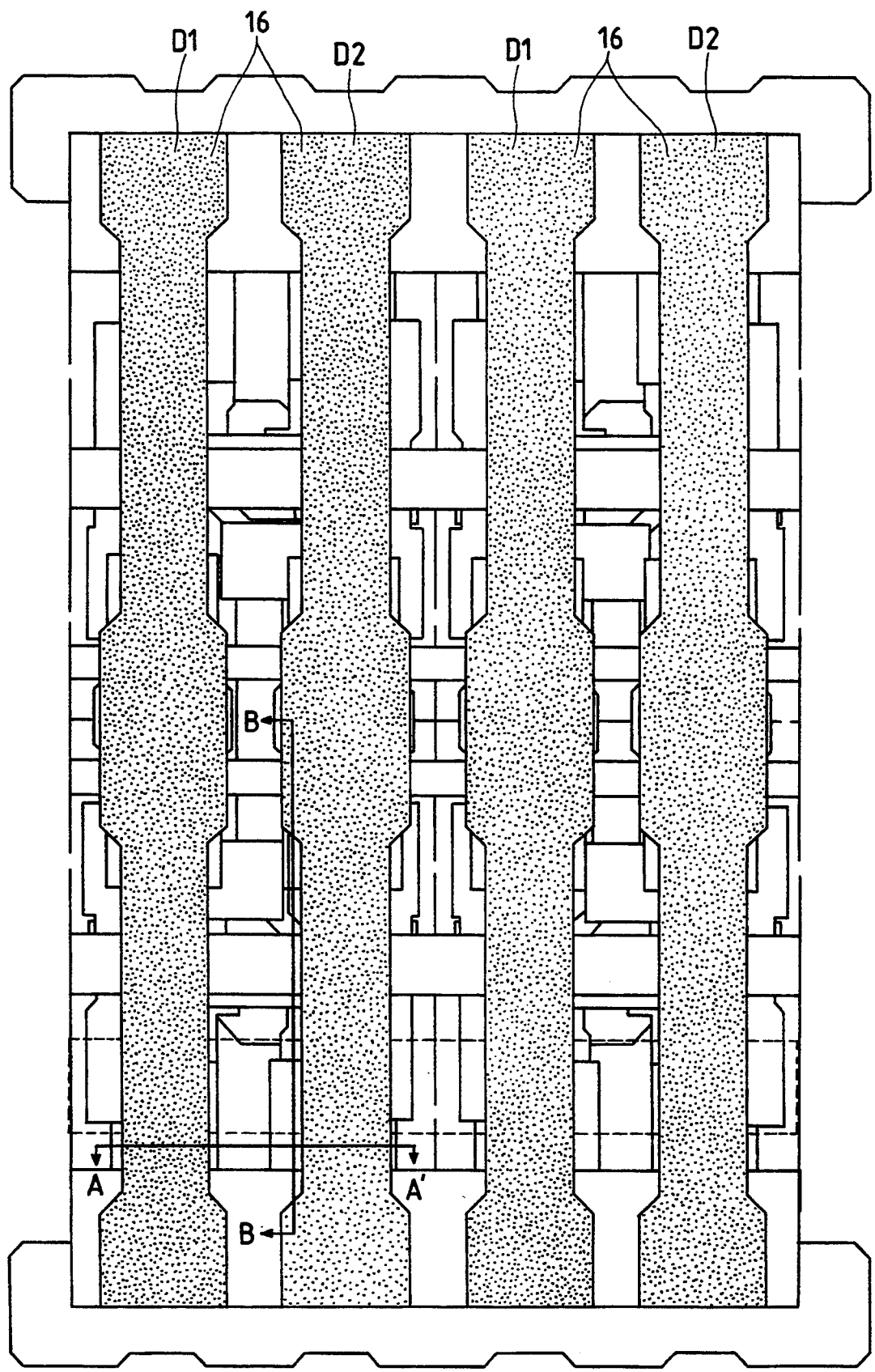
FIG. 18 is a top plan view showing a layout pattern of a second metal wiring layer.

As shown in FIGS. 9 and 18, the static semiconductor memory device is equipped with four data output terminals DO0 to DO8 and four data input terminals DI0 to DI3. The data output terminals DO0 to DO3 are respectively coupled to the outputs of four data output buffers DOB0 to DOB3, which have their inputs coupled to corresponding coupled common data lines (CD0 to CD3). As has been described hereinbefore, the eight first emitter-follower circuits (Q3 and Q4) disposed in the memory array ARY1 are given a wired OR construction and are coupled to the second emitter-follower circuits (Q12 and Q13). As to the memory arrays ARY2 to ARY4, too, the eight emitter-follower circuits (Q3 and Q4) disposed in the corresponding memory arrays are given the wired OR construction and are coupled to the second emitter-follower circuits (Q12 and Q13). The second emitter-follower circuits (Q12 and Q13) disposed in the memory array ARY1 in each memory mat are given the wired OR constructed and are coupled to the coupled common data lines CD0, which are coupled to the input of the data output buffer DOB0. Likewise, the second emitter follower circuits (Q12 and Q13) disposed in the memory array ARY2-4 in each memory mat are given the wired OR constructed and are coupled to the coupled common data lines CD1 to CD3, which are respectively coupled to the inputs of the data output buffers DOB1 to DOB3.

The four data input terminals DI0 to DI3 are respectively coupled to the inputs of data input buffers DIB0 to DIB3, which have their outputs respectively coupled through delay circuits to the inputs of write amplifiers (WRITE AMP. or W.A.) provided to correspond to the memory arrays ARY1 to ARY4 of each memory mat.

In order to control the data inputting and outputting operations, there are also provided an external terminal $\overline{CS}$ for receiving a chip select signal and external terminals WE1 and WE2 for receiving write enable signals. The external terminals $\overline{CS}$, and WE1 and WE2 are respectively coupled to a chip select signal input buffer CSB and a write enable signal input buffer WEB.

When the chip select signal indicates a chip select state and when the write enable signal indicates a write state, the static semiconductor memory device is in the write mode so that the write data fed to the data input buffers DIB0 to DIB3 are written in the four memory cells in the selected memory mat. When the chip select signal indicates a chip select state and when the write enable signal indicates a read state, the static semiconductor memory device is in the read mode so that the data stored in the four memory cells in the selected memory mat are outputted from the data output buffers DOB1 to DOB3. When the chip select signal indicates a chip unselect state, the disable buffer DISB coupled to the chip select signal input buffer CSB controls the data output buffers DOB0 to DOB3 so that the outputs of the data output buffers DOB1 to DOB3 may come into a high-impedance state.

Figure 13:
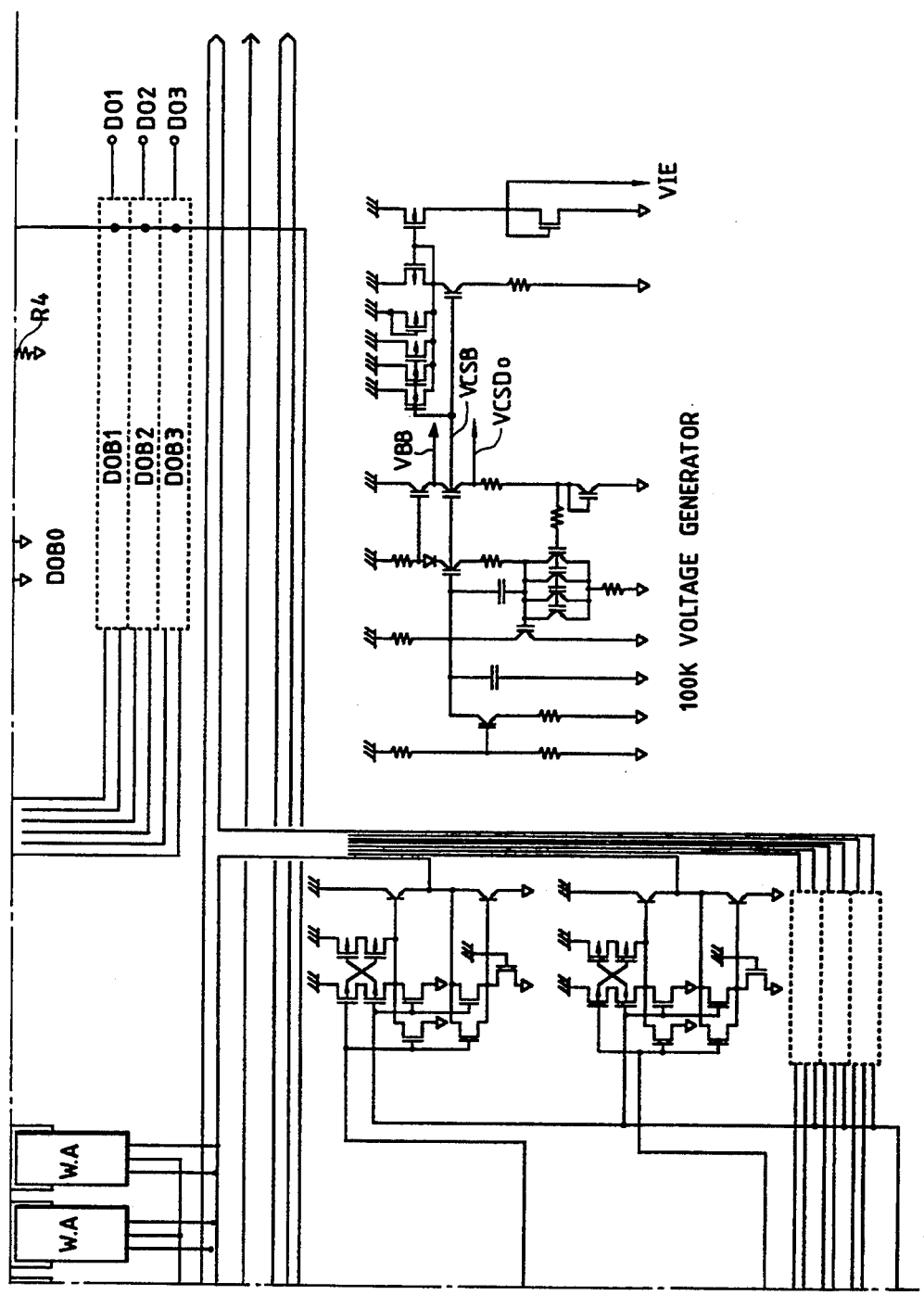
FIG. 13 is a circuit diagram showing a further portion of a more detailed logic circuit of the static semiconductor memory device of the present invention.

This static semiconductor memory device is used as an ECL interface so that it includes a voltage generator for 100 K, as shown in FIG. 13. This voltage generator generates a reference potential VBB to be fed to the address input buffer (AIB), a constant voltage VCSD0 to be fed to the data output buffers, and a constant voltage VIE to be fed to the current source of the address input buffer (AIB) or another current source.

FIGS. 14 to 18 are top plan views for schematically explaining the layout and the manufacture process of the memory cell CELL which can be used in the static semiconductor memory device of the present invention. These Figures are shown in relation to the regions C1 to C4 to be formed with the four memory cells CELL, which are arrayed at one unit of the layout in a matrix shape, in case they are applied to the practical static semiconductor memory device, thus constructing the aforementioned memory mats. The manufacture process will be schematically described in the following with reference to FIGS. 14 to 18.

Figure 14:
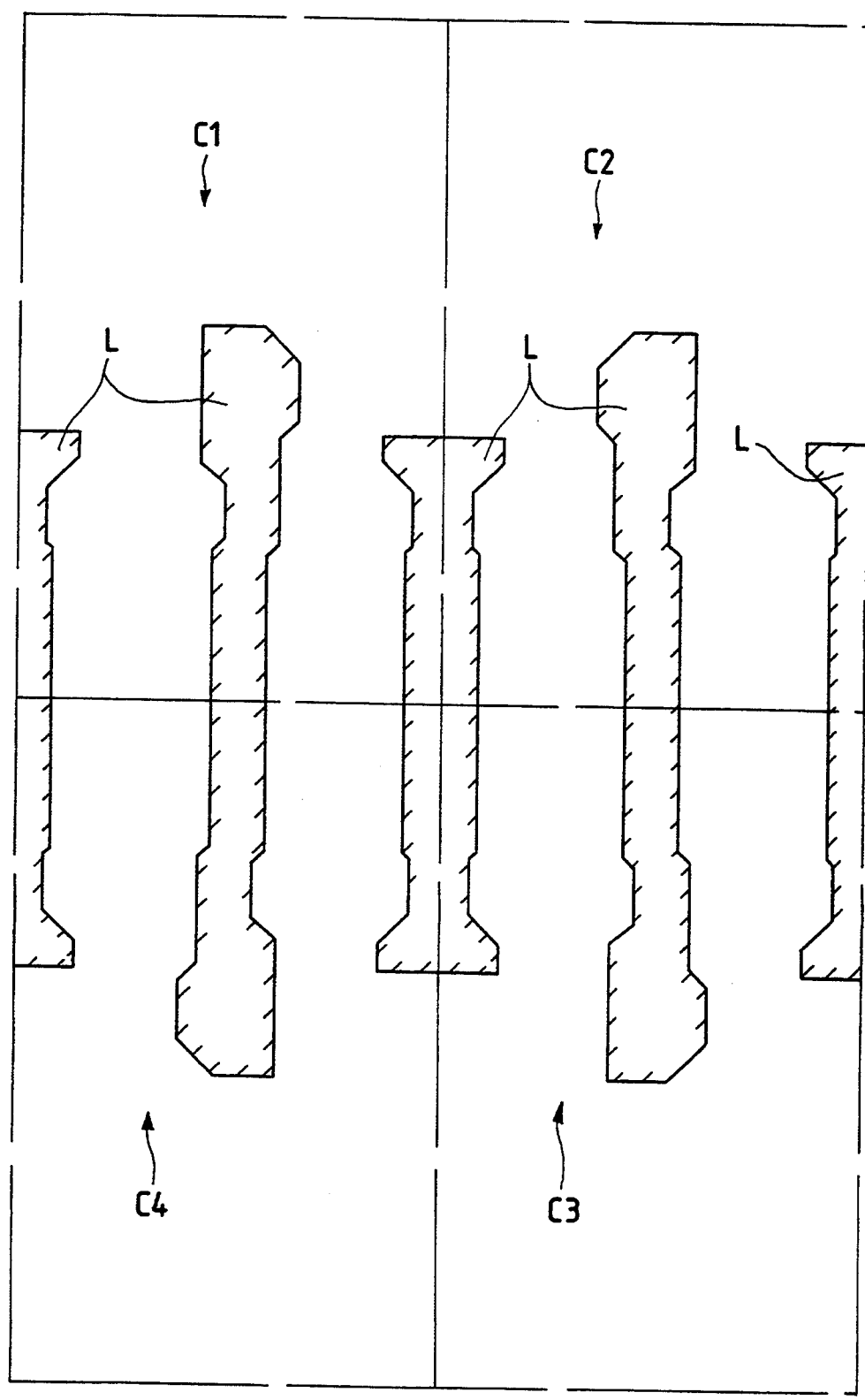
FIG. 14 is a top plan view showing a layout pattern of a field oxide film (of $SiO_2$)

FIG. 14 presents a layout pattern of a field oxide film L made of silicon oxide ($SiO_2$) or the like over a single crystal semiconductor substrate of silicon or the like. This field oxide film L is formed by forming a non-oxidizable mask of silicon nitride film (SiN) or the like selectively over the semiconductor substrate and by subsequently oxidizing the main surface exposed from the semiconductor substrate. Thus, the field oxide film L has its layout pattern simplified.

Figure 15:
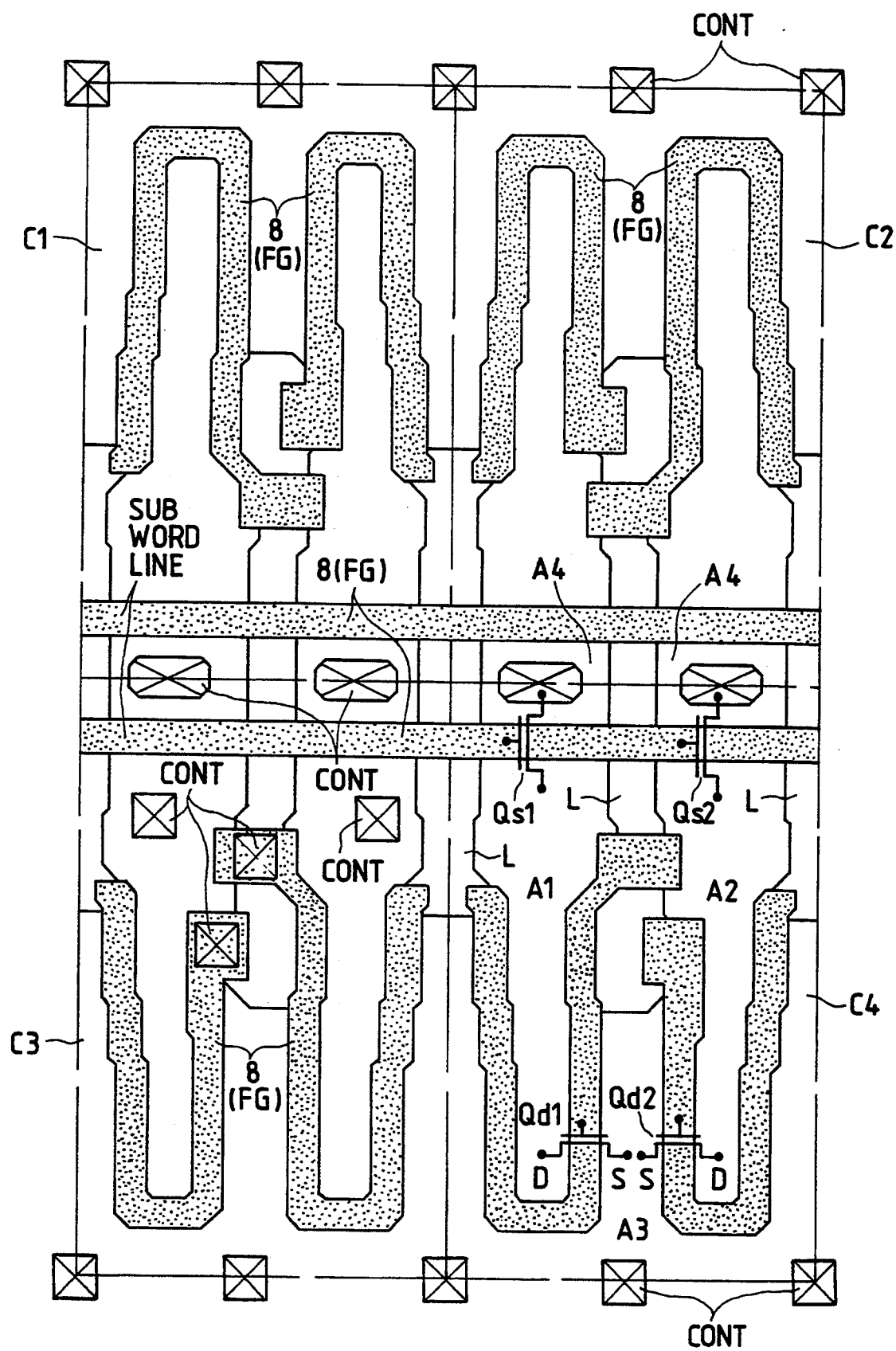
FIG. 15 is a top plan view showing a layout pattern of a first polysilicon wiring layer.

FIG. 15 is a top plan view showing a layout pattern of a first polysilicon wiring layer (FG) 8. This first polysilicon wiring layer (FG) 8 is composed of an N-type polysilicon (i.e., polycrystalline silicon) layer and tungsten silicide film $WSi_2$ formed over the former. A thin gate oxide film ($SiO_2$) is formed below the first polysilicon wiring layer (FG) 8. After this, an N-type impurity is introduced by using the field oxide film ($SiO_2$) L and the first polysilicon wiring layer (FG) 8 as an impurity doping mask.

The first polysilicon wiring layer (FG) 8, as folded in the shape of letter "U", corresponds to the gate electrodes of the driver MOSFETs Qd1 and Qd2 of the memory cell CELL, and the first polysilicon wiring layer (FG) 8, as given a straight shape, corresponds to the subword lines and the gate electrodes of the selecting MOSFETs Qs1 and Qs2 of the memory cell CELL. As a result, the inside region A1 or A2, which is enclosed by the subword lines, the gate electrode of the drive MOSFET Qd1 or Qd2 and the field oxide film ($SiO_2$) L, are used as the drain region (D) of the drive MOSFETs Qd1 and Qd2 and the drain or source regions of the selecting MOSFETs Qs1 and Qs2. The outside region A3 of the gate electrode of the drive MOSFET Qd1 or Qd2 and the field oxide film ($SiO_2$) L is used as the source region (S) of the drive MOSFETs Qd1 and Qd2. Moreover, the inside region A4 enclosed by the subword lines and the field oxide film ($SiO_2$) L is used as the drain or source regions of the selecting MOSFETs Qs1 and Qs2. As a result, even if the first polysilicon wiring layer (FG) 8 and the field oxide film ($SiO_2$) L fail to register, the drive MOSFETs Qd1 and Qd2 are kept away from having their characteristics unbalanced, to improve the characteristics of the memory cells.

After this, an insulation film 11 of $SiO_2$ is prepared and formed with contact holes CONT, as shown in FIG. 15. These contact holes CONT are provided for connecting a second polysilicon wiring layer 12 shown in FIG. 16 with the regions A1 to A4 and the gate electrode of the MOSFET Qd1 or Qd2. Incidentally, the contact holes CONT, as shown in a region C3 in FIG. 15, are also formed in the corresponding portions of other regions C1, C2 and C4 but are not shown so as to avoid complication of illustrations.

Figure 16:
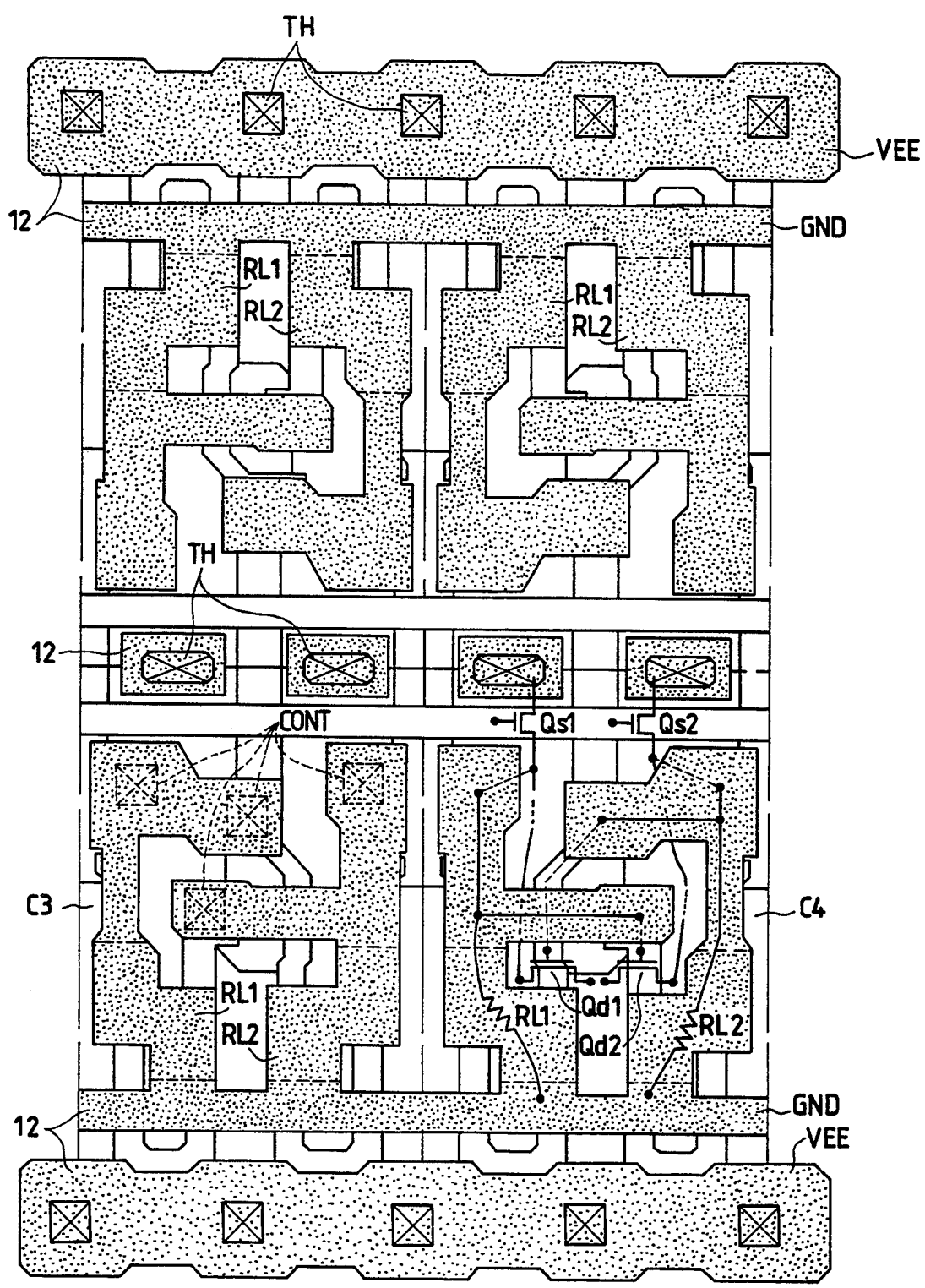
FIG. 16 is a top plan view showing a layout pattern of a second polysilicon wiring layer.

FIG. 16 is a top plan view showing a layout pattern of the second polysilicon (i.e., polycrystalline silicon) wiring layer (SG) 12. The regions, as defined by single-dotted lines in the wiring layer (SG) 12, are used as the highly resistive loads RL1 and RL2 of the memory cell CELL. These regions for the highly resistive loads RL1 and RL2 can be formed by forming the pattern of the second polysilicon wiring layer (SG) 12 and by subsequently doping the second polysilicon wiring layer (SG) 12 with an N-type impurity by using the impurity doping mask which is formed over the regions to be formed with the highly resistive loads RL1 and RL2.

In the region C3, the contact holes CONT shown in FIG. 15 are indicated by broken lines so that the connection relations between the gate electrodes of the regions A1 and A2 and the drive MOSFETs Qd1 and Qd2 and the wiring layer (SG) 12 could be understood.

In the region C4, there are shown the connection relations between the elements Qs1, Qs2, Qd1, Qd2, RL1 and RL2 composing the memory cell CELL. In the region C4: solid lines indicate the connections in the wiring layer (SG) 12; triple-dotted lines indicate the connections in the regions A1 and A2; and broken lines indicate the connections through the wiring layer (FG) 8. By thus forming the gate electrodes of the drive MOSFETs Qd1 and Qd2 of the wiring layer (FG) 8 folded in the U-shape, the gate electrodes and drain regions of the individual drive MOSFETs Qd1 and Qd2 can be crossly coupled by the two layers, i.e., the wiring layer (FG) 8 and the wiring layer (SG) 12.

Incidentally, the wiring layer (SG) 12 is fed with the first and second power-supply potentials GND and VEE, as shown in FIG. 16.

After this, there is formed an inter-layer insulation film 13 which is made of $SiO_2$ and boron silicate glass (i.e., BPSG), for example. This insulation film 13 is formed with through holes TH, as shown. These through holes TH are provided for connecting the second polysilicon wiring layer 12 and a first metal wiring layer (of aluminum) 14 shown in FIG. 17.

Figure 17:
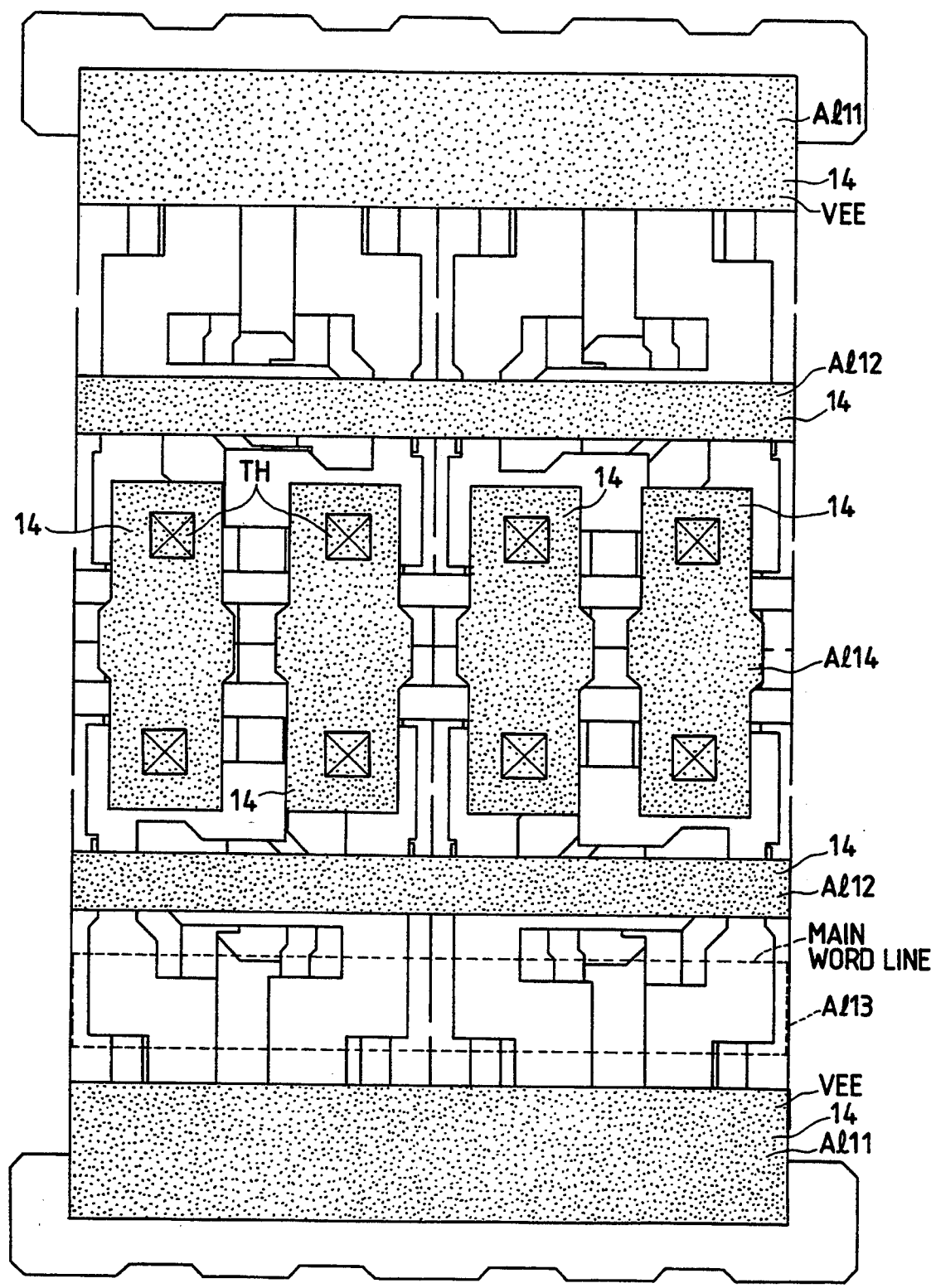
FIG. 17 is a top plan view showing a layout pattern of a first metal wiring layer.

FIG. 17 is a top plan view showing a layout pattern of the first metal wiring layer 14 made of aluminum, for example. This metal wiring layer 14 is formed to include: a wider wiring layer Al11 to be fed with the second power-supply potential VEE; a wiring layer Al12 to be used for reducing the parasitic resistance of the subword lines; a wiring layer Al13 to be used as the main word lines, as indicated by broken lines; and a wiring layer Al14 provided for connecting the wiring layer (SG) 12, which is connected with the region A4, with a second metal wiring layer (of aluminum) 16 acting as data lines. The wiring layer Al12 is coupled in another not-shown portion to the polysilicon wiring layer (FG) 8 of the subword lines.

Since the wiring layer Al11 is made wide, its parasitic resistance is reduced. Thus, by forming the gate electrodes of the drive MOSFETs Qd1 and Qd2 of the wiring layer (FG) 8 folded in the U-shape, the parasitic resistance of the wiring layer Al11 is reduced, even if the drivabilities of the drive MOSFETs Qd1 and Qd2 are enhanced, so that the second power-supply potential VEE to be fed to the wiring layer Al11 can remain at a uniform level. As a result, the static semiconductor memory device has its reliability improved.

Incidentally, it could be apparent from FIGS. 6 to 9 that the main word lines are arranged in some memory cells but not in others.

After this, there is formed an inter-layer insulation film 15 which is composed of a tetraethoxysilane film (i.e., PTEOS) formed by the plasma deposition method and a silicon oxide film ($CVD.SiO_2$) formed by the chemical vapor deposition method. The insulation film 15 thus prepared is formed with the through holes TH, as shown. These through holes TH are provided for connecting the first metal wiring layer (of aluminum) 14 and the second metal wiring layer (of aluminum) 16 shown in FIG. 18.

FIG. 18 is a top plan view showing a layout of the second metal wiring layer (made of aluminum, for example) 16. This second metal wiring layer 16 is used for forming the coupled complementary data lines D1 and D2.

After this, a passivation film of silane (SiL), for example, is formed all over the surface.

Figure 19:
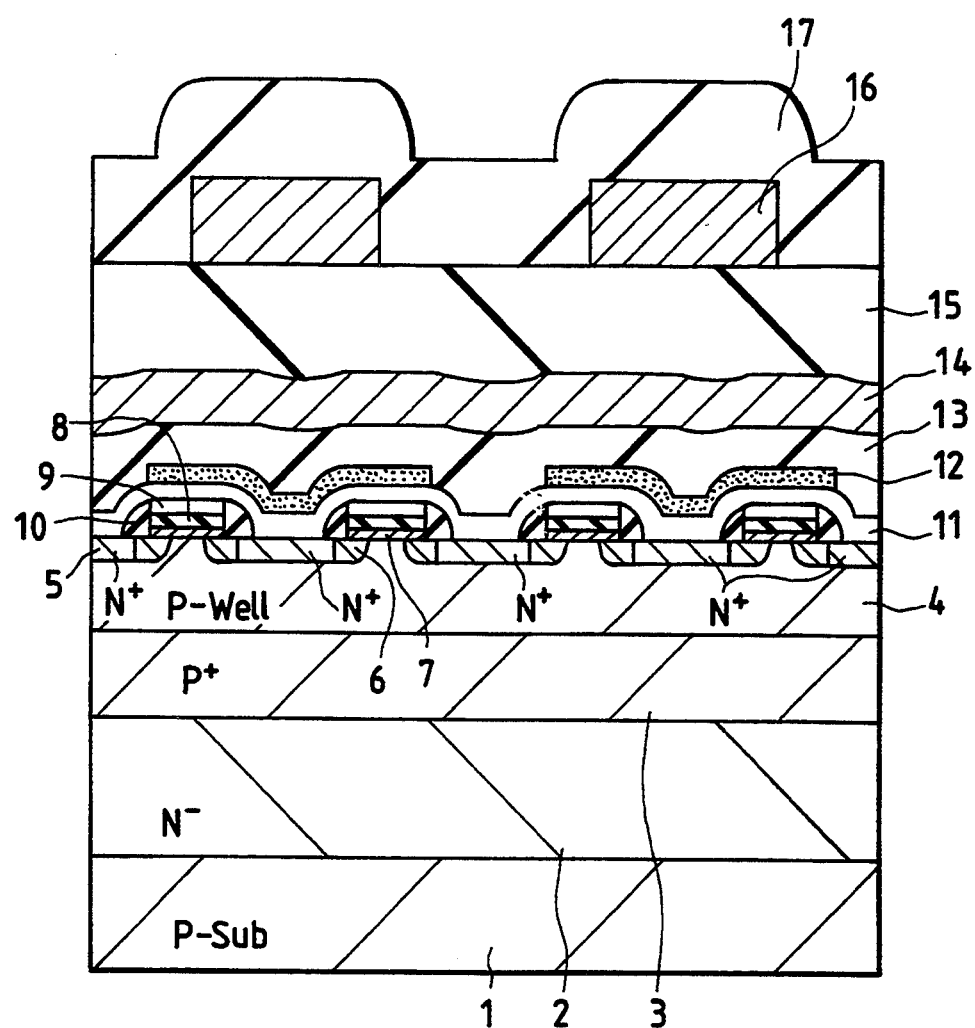
FIG. 19 is a section of the device taken along line A-A' of FIG. 18.
Figure 20:
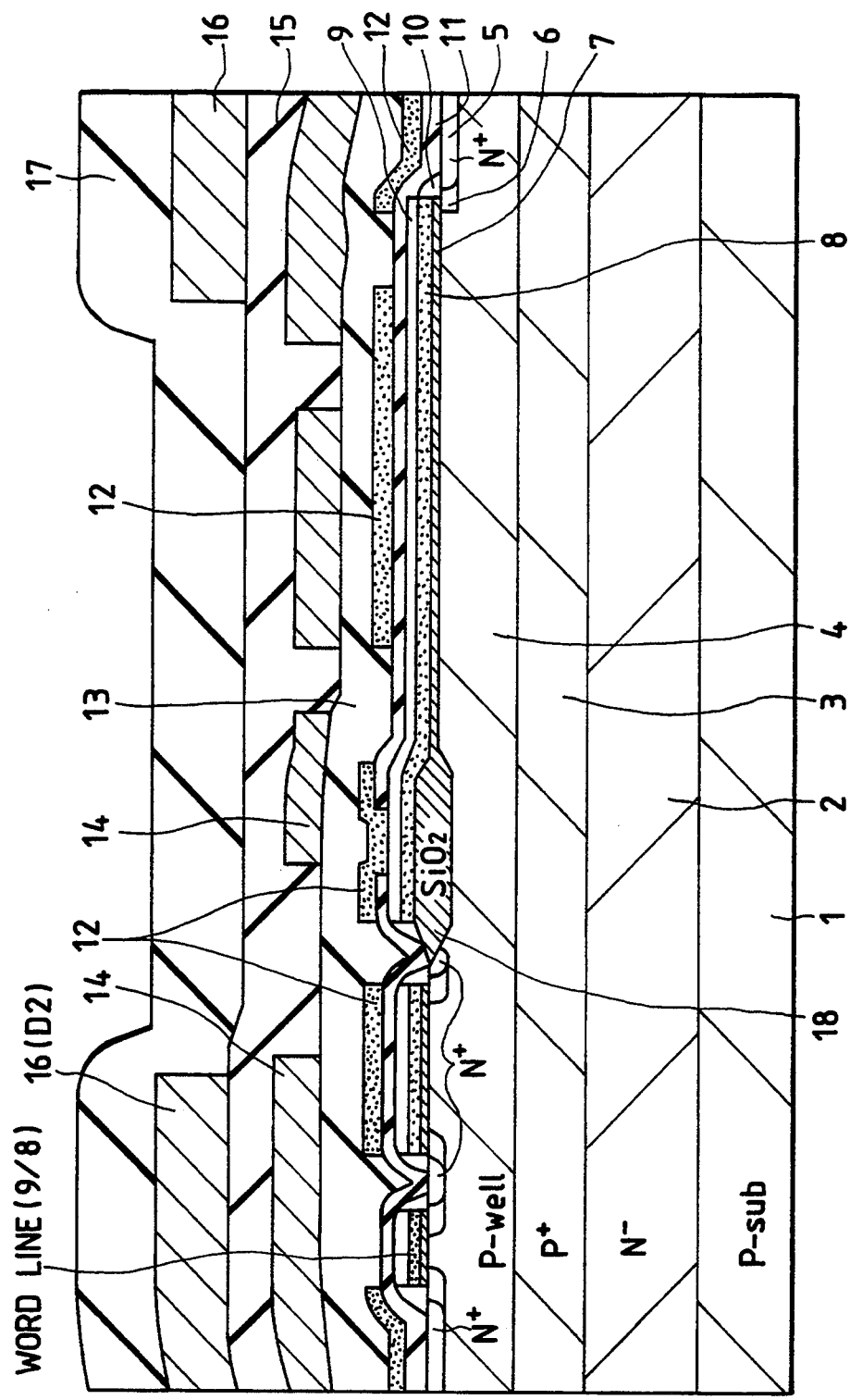
FIG. 20 is a section of the device taken along line B-B' of FIG. 18.

FIG. 19 is a section showing the device and taken along line A-A' of FIG. 18. FIG. 20 is a section showing the device and taken along line B-B' of FIG. 18. The device will be described in the following with reference to the sections of FIGS. 19 and 20. The semiconductor body is made of single crystal silicon and includes a P$^-$-type semiconductor substrate P-Sub 1, an N$^-$-type buried layer 2, a P$^-$-type buried layer 3 and a p-type well layer 4. The P-type well layer 4 is formed therein with the N$^-$-type source/drain regions 5 and N$^-$-type source/drain regions 6 (i.e., lightly doped drain regions) of the selecting MOSFET Qs2 (or Qs1) and the drive MOSFETs Qd1 and Qd2.

The N$^-$-type source/drain region 6 is formed by introducing an N-type impurity lightly, exemplifying its mask by both the first polysilicon wiring layer (FG) as the gate electrodes of the MOSFETs and a gate oxide film 7 formed below the former. The first polysilicon wiring layer (FG) is formed of the N-type polysilicon (i.e., polycrystal silicon) layer 8 and a tungsten silicide ($WSi_2$) layer 9 formed over the former, and the gate oxide film 7 is formed of a silicon oxide film. On the other hand, the N$^-$-type source/drain region 5 is formed by introducing an N-type impurity heavily, exemplifying the first polysilicon wiring layer (FG) and a side wall spacer 10 formed of a silicon oxide film on the sides of the former.

Reference numeral 11 designates an insulation film which is formed of silicon oxide ($CVD.SiO_2$) by the chemical vapor deposition method; numeral 12 a second polysilicon wiring layer (FG); numeral 13 an inter-layer insulation film formed of two overlapped layers of a silicon oxide film $SiO_2$ and a boron silicate glass film (BPSG) formed over the former; numeral 14 a first metal wiring layer (of aluminum); numeral 15 an inter-layer insulating film formed of three overlapped layers of a tetraethoxysilane film (PTEOS), a silicon oxide film (CVD. $SiO_2$) formed over the former, and a tetraethoxysilane film (PTEOS) formed over the second layer; numeral 16 a second metal wiring layer (of aluminum); and numeral 18 a field oxide film (L) of silicon oxide $SiO_2$.

Figure 21:
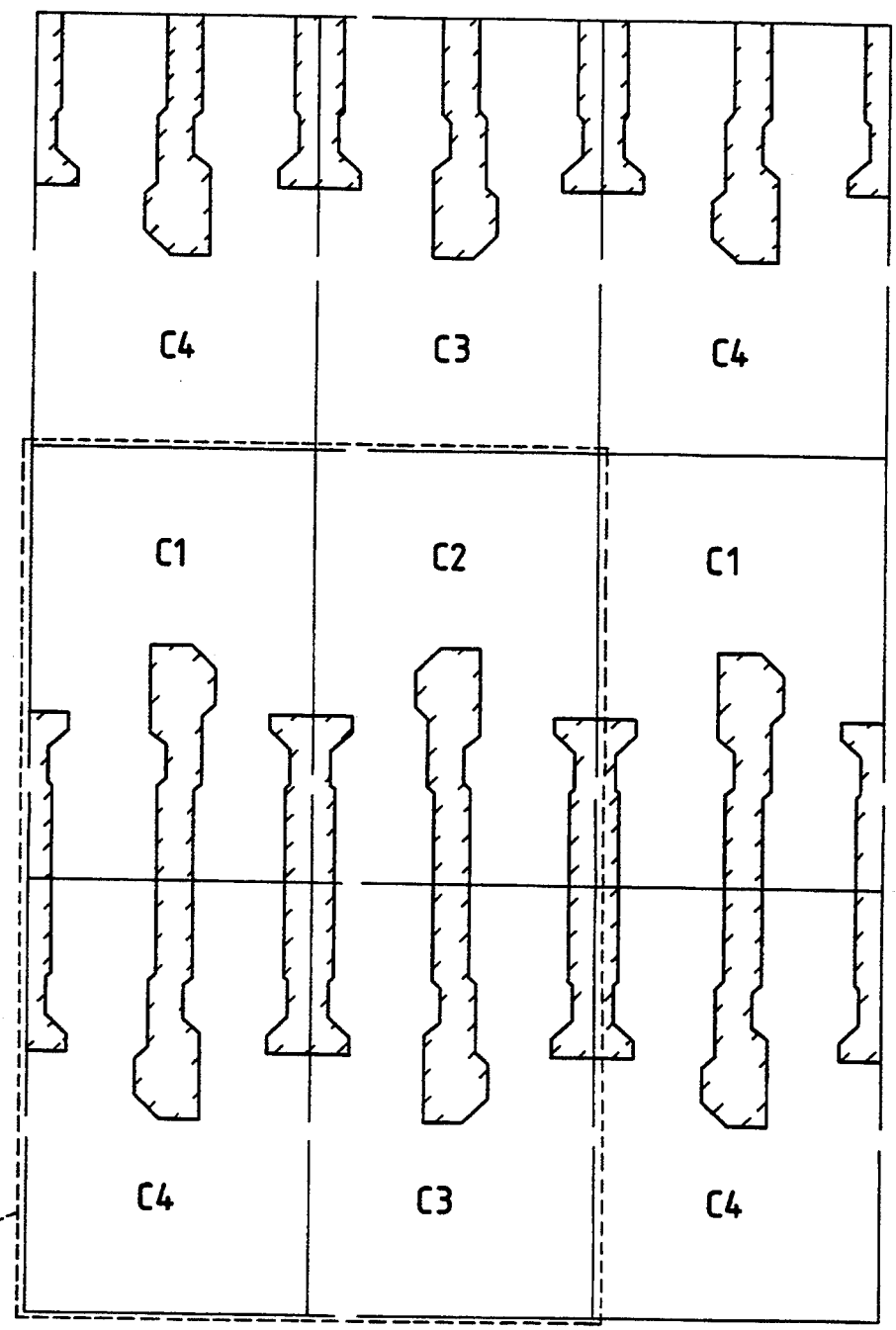
FIG. 21 is a layout pattern diagram of nine memory cells corresponding to FIG. 14.
Figure 22:
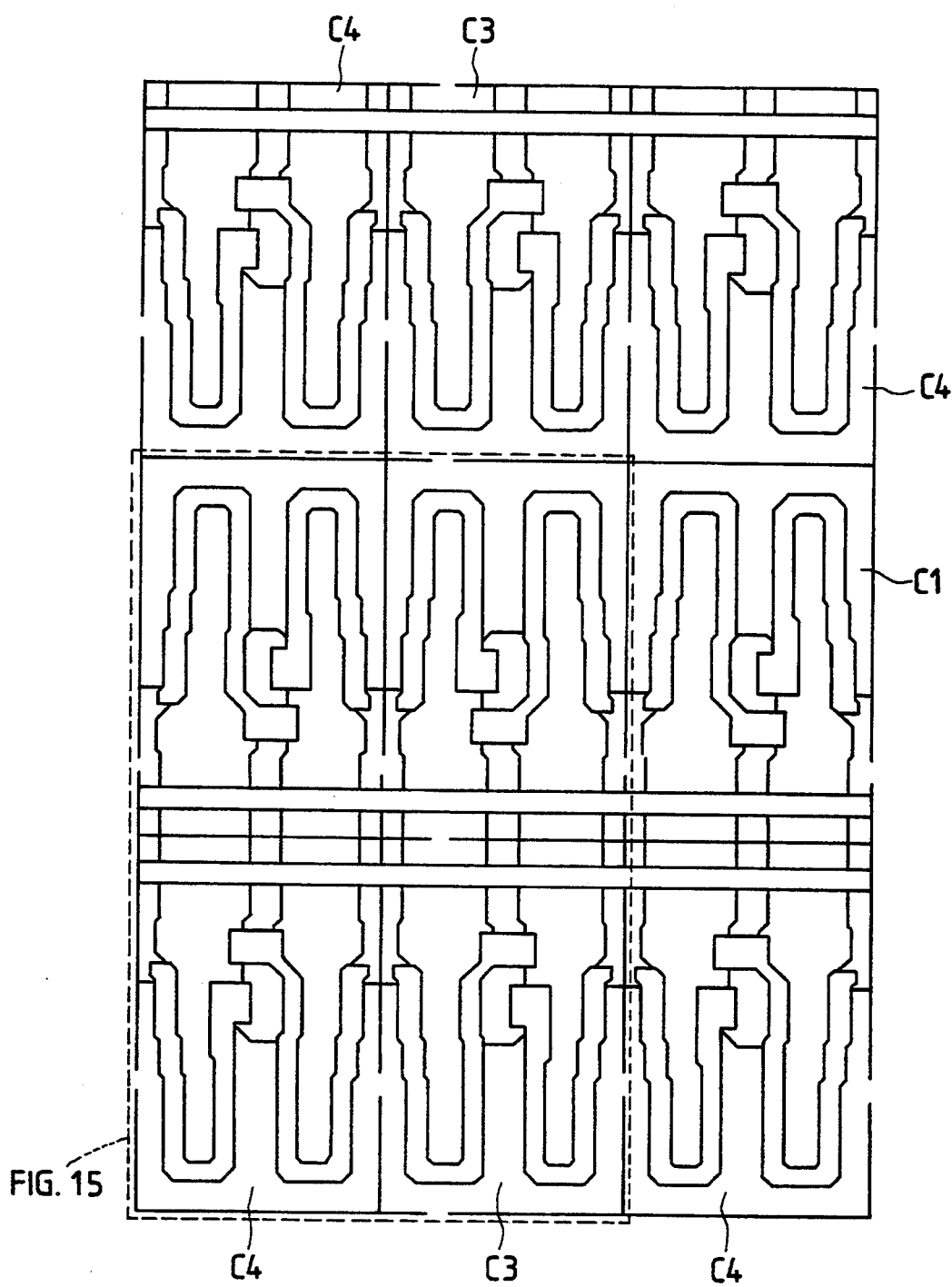
FIG. 22 is a layout pattern diagram of nine memory cells corresponding to FIG. 15.

FIGS. 21 and 22 shows layout of nine memory cells. In FIGS. 21 and 22, the portions, as enclosed by broken lines, are the layout portions corresponding to FIGS. 15 and 16. As to the layout of the nine memory cells, the layouts corresponding to FIGS. 17 and 18 could be easily analogized although not described. Thus, the wider wiring layer A111 to be fed with the second power-supply potential VEE, as shown in FIG. 17, is coupled to the wiring layers A111 of other memory cells so that its width is larger than that shown in FIG. 17.

Thus, the following effects can be achieved by forming the drive MOSFET gates of the memory cells CELL into the shape of letter "U": (1) the memory cell area is reduced to about one half as large as that of the straight type; (2) the parasitic resistance is reduced to about one half as high as that of the straight type so that the potential drop of the current path can be suppressed to stabilize the operation; (3) the dispersion of the diffusion resistance due to the failure to register with the diffusion layer is eliminated by separating the inside of the diffusion layer into the source and drain by the gate only; and (4) the current path need not be constructed by using the gate electrode as a conductor so that it can be stable. At the same time, there need be formed no contact hole for connecting the diffusion layer and the gate.

In the semiconductor memory device of the present invention, the data read from the memory cells to the coupled complementary data lines or common data lines are fed directly to the output circuit not through the sense amplifier circuit. This eliminates the delay time of the sense amplifier circuit itself from the address access time of the semiconductor memory device of the prior art using the sense amplifier circuit so that the address access time of the semiconductor memory device of the present invention can be made shorter than that of the semiconductor memory device of the prior art.

Moreover, since the individual drive MOS transistors have their gates folded back into the U-letter shape, the increase in the layout area of the individual memory cells is suppressed even though each of the memory cells has a high drivability characteristic. This makes it possible to provide a semiconductor memory device having a quick operation and a high memory capacity if memory cells composed of the drive MOS transistors having the U-shaped gates are used in the semiconductor memory device having no sense amplifier circuit.

Moreover, the selection of the plurality of word lines provided for one memory mat is so controlled that one of them may be selected while the others are left unselected. As a result, the number of memory cells to be selected at one time is reduced even if the highly drivable memory cells, composed of the drive MOS transistors having the U-shaped gates, are used in the semiconductor memory device, thus reducing the power consumption of the semiconductor memory device having the short address access time.

What is claimed is:

1. A semiconductor memory device comprising:
   a word line;
   a plurality of complementary data line pairs;
   a plurality of memory cells each of which is coupled to said word line and to one of the plurality of complementary data line pairs, each memory cell including a flip-flop circuit for storing information and select MOSFETs, and each of said select MOSFETs having a source-drain path which is directly coupled between a respective input/output node of said flip-flop circuit and one data line of a corresponding complementary data line pair;
   common data line pairs selectively coupled to one of the plurality of complementary data line pairs without using a sense amplifier circuit for amplifying a first potential difference which appears between said complementary data line pairs in accordance with a data readout of a selected memory cell; and
   an output buffer including a pair of input terminals coupled to said common data line pairs and means for amplifying a second potential difference which appears between said common data line pairs,
   wherein each of said memory cells is provided with a driving capability sufficient for driving said output buffer without using a sense amplifier circuit.

2. A semiconductor memory device according to claim 1,
   wherein said flip-flop circuit includes a pair of cross-coupled driver MOSFETs, in which the gate and drain of one driver MOSFET are coupled to the drain and gate of the other one of said pair of driver MOSFETs, respectively, and a pair of load elements coupled between the drains of said pair of driver MOSFETs and a power-supply potential node, respectively, and
   wherein the source-drain path of each of said select MOSFETs of a memory cell is coupled between a drain of a respective driver MOSFET of said memory cell and a data line of a corresponding pair of complementary data lines.

3. A semiconductor memory device according to claim 2, wherein said pair of driver MOSFETs of a memory cell have U-shaped gate electrodes, respectively.

4. A semiconductor memory device according to claim 3, further comprising a first level shift circuit coupled between one of the complementary data line pairs and said common data line pairs.

5. A semiconductor memory device according to claim 4, wherein said first level shift circuit includes a first bipolar transistor and a second bipolar transistor.

6. A semiconductor memory device according to claim 5, wherein said first bipolar transistor has a base coupled to one data line of a pair of the complementary data lines and an emitter coupled to one common data line of a pair of common data lines, said second bipolar transistor having a base coupled to the other data line of said pair of the complementary data lines and an emitter coupled to the other common data line of said pair of common data lines.

7. A semiconductor memory device according to claim 6, further comprising a second level shift circuit coupled between a pair of common data lines and the pair of input terminals of said output buffer.

8. A semiconductor memory device according to claim 7, wherein said second level shift circuit includes a third bipolar transistor and a fourth bipolar transistor.

9. A semiconductor memory device according to claim 8, wherein said third bipolar transistor has a base coupled to one common data line of said pair of common data lines and an emitter coupled to one of the pair of input terminals of said output buffer, said fourth bipolar transistor having a base coupled to the other one of said pair of common data lines and an emitter coupled to the other one of the pair of input terminals of said output buffer.

10. A semiconductor memory device according to claim 9,
    wherein said plurality of memory cells include a first plurality of memory cells and a second plurality of memory cells, wherein said plurality of complementary data line pairs include a first plurality of complementary data line pairs corresponding to said first plurality of memory cells and a second plurality of complementary data line pairs corresponding to said second plurality of memory cells, wherein said word line includes a first subword line corresponding to said first plurality of memory cells and a second subword line corresponding to said second plurality of memory cells, and wherein said semiconductor memory device includes a main word line and means for selectively transferring a signal on the main word line to one of the first or second subword lines.

11. A semiconductor memory device according to claim 3, wherein said pair of driver MOSFETs of each of the memory cells have gate electrodes with widths dimensioned for enhancing the driving characteristic thereof and which gate electrodes are U-shaped, respectively.

12. A semiconductor memory device according to claim 11, further comprising a plurality of first level shift circuits, each one of which is coupled between a respective pair of complementary data lines and a common data line pair.

13. A semiconductor memory device according to claim 12, wherein each said first level shift circuit includes first and second bipolar transistors connected as emitter followers, the base of the first and second bipolar transistors being coupled to said respective pair of complementary data lines and the emitters thereof being coupled to said common data line pair, respectively.

14. A semiconductor memory device according to claim 13, further comprising a plurality of second level shift circuits, each one of which is coupled between a respective one of said common data line pairs, corresponding to first common data line pairs, and a pair of input terminals of a respective one of plural output buffers, the coupling of each of said second level shift circuits to the input terminals of a respective output buffer is via a corresponding one of second common data line pairs.

15. A semiconductor memory device according to claim 14, wherein each said second level shift circuit includes third and fourth bipolar transistors connected as emitter followers, the bases of the third and fourth bipolar transistors being coupled to respective ones of said first common data line pair and the emitters thereof being coupled via respective ones of said second common data line pair to the input terminals of a corresponding output buffer.

16. A semiconductor memory device according to claim 15, wherein said plurality of first level shift circuits include first and second sets of first level shift circuits corresponding to first and second pluralities of complementary data line pairs, respectively, said first set of first level shift circuits effecting wired-OR connections to one of the first common data line pairs, and said second set of first level shift circuits effecting wired-OR connections to another one of the first common data line pairs.

17. A semiconductor memory device according to claim 16,
wherein said word line includes at least one first subword line corresponding to a first plurality of memory cells, coupled to the first plurality of complementary data line pairs, and at least one second subword line corresponding to a second plurality of memory cells, coupled to the second plurality of complementary data line pairs, and wherein said semiconductor memory device includes a main word line and means for selectively transferring a signal on the main word line to one of the first and second subword lines.

18. A semiconductor memory device according to claim 17, wherein the load elements of each flip-flop circuit are formed of resistive elements or MOS elements.

19. A semiconductor memory device according to claim 17, wherein the load elements of each flip-flop are poly-Si resistive elements.

20. A semiconductor memory device according to claim 3, wherein the load elements of each flip-flop circuit are formed of resistive elements or MOS elements.

21. A semiconductor memory device according to claim 3, wherein the load elements of each flip-flop are poly-Si resistive elements.

22. A semiconductor memory device according to claim 2, wherein the device is formed on a single semiconductor substrate.

23. A semiconductor memory device according to claim 17, wherein the device is formed on a single semiconductor substrate.

24. A semiconductor memory device according to claim 10, wherein the device is formed on a single semiconductor substrate.

* * * * *